United States Patent
Tokumitsu

(10) Patent No.: US 9,691,852 B2
(45) Date of Patent: Jun. 27, 2017

(54) SEMICONDUCTOR DEVICE

(71) Applicant: Renesas Electronics Corporation, Kawasaki-shi, Kanagawa (JP)

(72) Inventor: Shigeo Tokumitsu, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 14/704,355

(22) Filed: May 5, 2015

(65) Prior Publication Data
US 2015/0349055 A1 Dec. 3, 2015

(30) Foreign Application Priority Data

Jun. 3, 2014 (JP) .................................. 2014-115133

(51) Int. Cl.
*H01L 29/06* (2006.01)
*H01L 29/861* (2006.01)
(Continued)

(52) U.S. Cl.
CPC ...... *H01L 29/0692* (2013.01); *H01L 29/0619* (2013.01); *H01L 29/0649* (2013.01); *H01L 29/66659* (2013.01); *H01L 29/7835* (2013.01); *H01L 29/8611* (2013.01); H01L 27/0922 (2013.01); H01L 29/0653 (2013.01); H01L 29/1045 (2013.01); H01L 29/1083 (2013.01); H01L 29/1087 (2013.01)

(58) Field of Classification Search
CPC ........... H01L 21/76229; H01L 29/0603; H01L 29/0692; H01L 29/66659; H01L 29/0619; H01L 29/7835; H01L 29/8611; H01L 29/0649

See application file for complete search history.

(56) References Cited

U.S. PATENT DOCUMENTS 5,104,816 A * 4/1992 Verret ................ H01L 29/7325
257/E21.375
6,518,144 B2 * 2/2003 Nitta ................ H01L 21/76237
148/DIG. 50
(Continued)

FOREIGN PATENT DOCUMENTS

JP 2002-118256 A 4/2002
JP 2011-66067 A 3/2011

OTHER PUBLICATIONS

Rung, R.D., "Deep Trench Isolated CMOS Devices", IEEE, 1982, pp. 237-423.*

*Primary Examiner* — A. Sefer
*Assistant Examiner* — Vincent Wall
(74) *Attorney, Agent, or Firm* — Sughrue Mion, PLLC

(57) ABSTRACT

An element isolation trench is formed in a substrate and is formed along each side of a polygon in a planar view. A first trench is formed in the substrate and extends in a direction different from that of any side of the trench. A first-conductivity type region is formed on/over apart located on the side of an end of the first trench in the substrate. Accordingly, when an impurity region that extends in a depth direction in the substrate is formed by forming the trench in the substrate and diagonally implanting an impurity into the trench, the impurity is prevented from being implanted into a side face of a groove such as a groove for element isolation and so forth impurity implantation into the side face of which is not desired.

16 Claims, 24 Drawing Sheets

(51) Int. Cl.
*H01L 29/66* (2006.01)
*H01L 29/78* (2006.01)
H01L 29/10 (2006.01)
H01L 27/092 (2006.01)

(56) References Cited

U.S. PATENT DOCUMENTS

| | | | | |
|---|---|---|---|---|
| 7,141,486 B1* | 11/2006 | Rossi | ................ | H01L 21/76232 |
| | | | | 257/E21.549 |
| 8,357,989 B2 | 1/2013 | Onishi et al. | | |
| 2002/0063259 A1* | 5/2002 | Usui | ................... | H01L 29/0634 |
| | | | | 257/110 |
| 2004/0140527 A1* | 7/2004 | Furuya | ................ | H01L 27/0805 |
| | | | | 257/532 |
| 2006/0038206 A1* | 2/2006 | Shimoyama | ........ | H01L 21/6835 |
| | | | | 257/273 |
| 2007/0210410 A1* | 9/2007 | Hirler | ................ | H01L 29/0619 |
| | | | | 257/520 |
| 2009/0160009 A1* | 6/2009 | Dietz | .................... | H01L 21/743 |
| | | | | 257/506 |
| 2010/0155904 A1* | 6/2010 | Yune | .................... | H01L 27/105 |
| | | | | 257/618 |

* cited by examiner

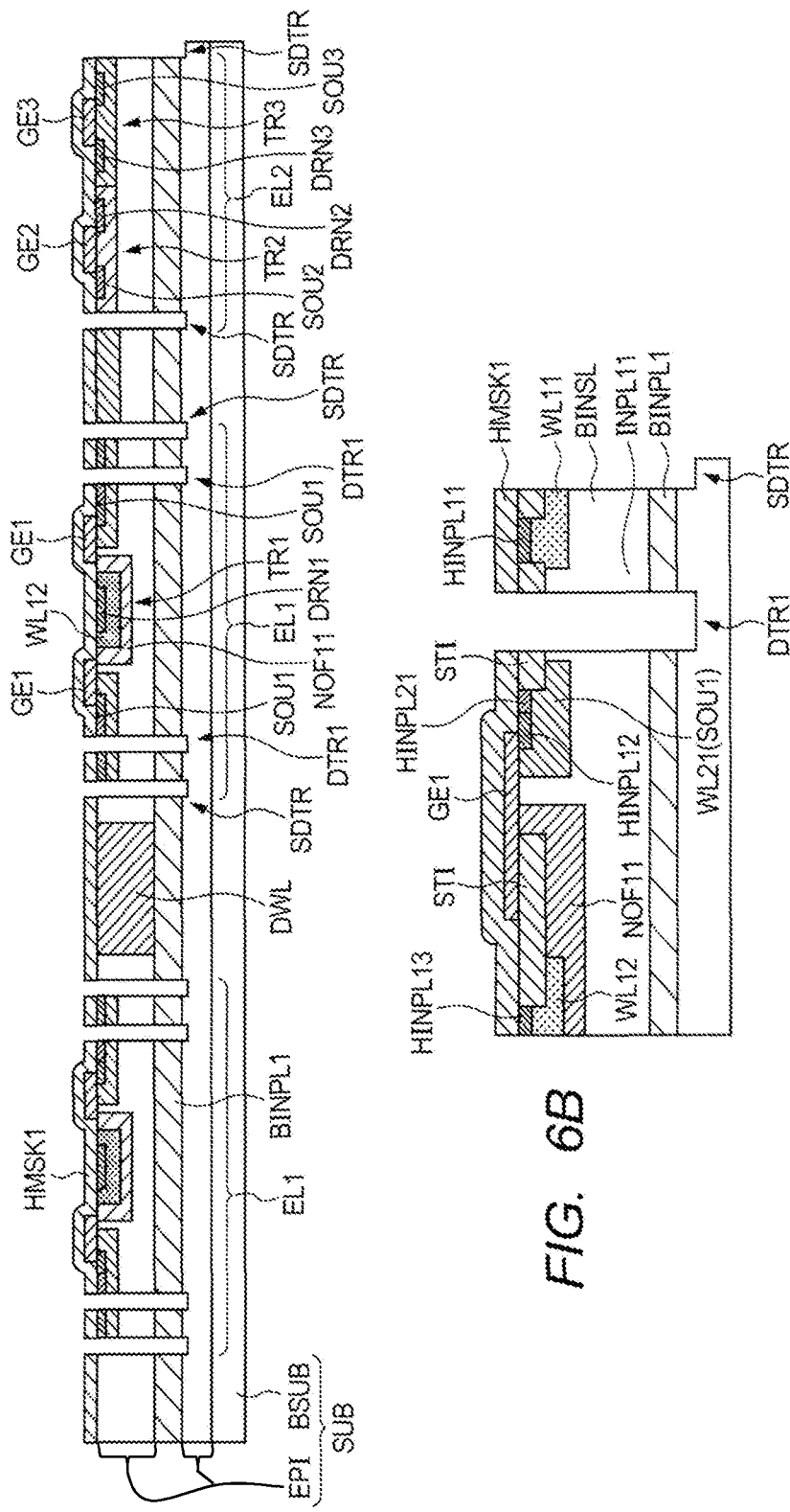

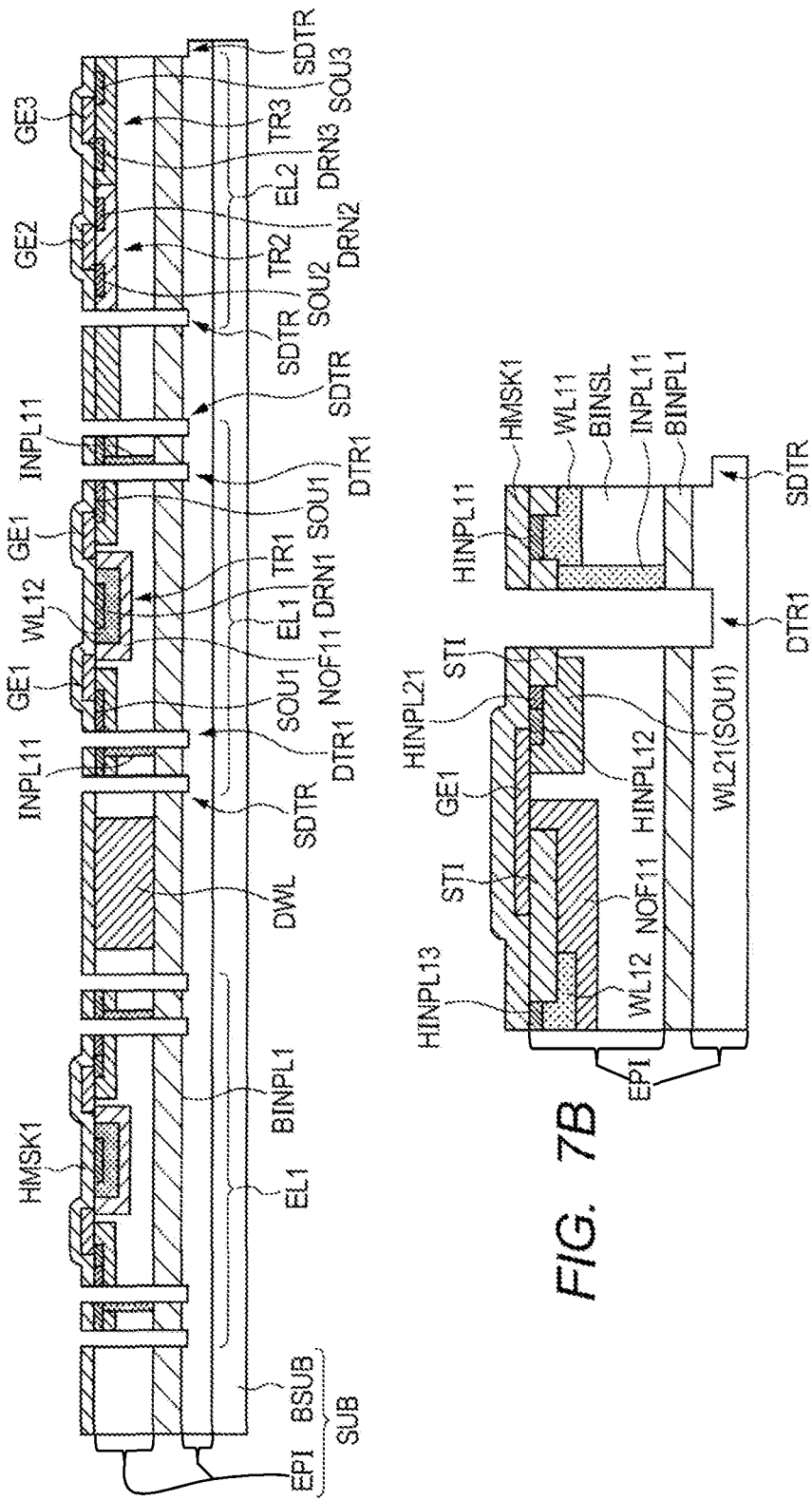

SEMICONDUCTOR DEVICE

CROSS-REFERENCE TO RELATED APPLICATIONS

The disclosure of Japanese Patent Application No. 2014-115133 filed on Jun. 3, 2014 including the specification, drawings and abstract is incorporated herein by reference in its entirety.

BACKGROUND

The present invention relates to a semiconductor device and concerns a technology applicable to the semiconductor device, for example, having a structure that an impurity has been implanted into a side face of a trench formed in a substrate.

In the semiconductor device, there are cases when the trench is formed in the substrate and an impurity region that extends in a depth direction in the substrate is formed by diagonally implanting the impurity into the trench. Japanese Unexamined Patent Application Publication No. 2002-118256 describes that a low concentration impurity layer is epitaxially grown on a high concentration impurity substrate, the trench that reaches the high concentration impurity substrate is formed in the low concentration impurity layer and the impurity is diagonally implanted into the trench. In this case, an n-type impurity region is formed on one side face of the trench and a p-type impurity region is formed on the opposite side face of the trench by implanting ions of an n-type impurity from a first direction and implanting ions of a p-type impurity from the side opposite to the first direction.

On the other hand, Japanese Unexamined Patent Application Publication No. 2011-66067 describes that element isolation is performed by forming a groove so as to surround an element in a substrate with elements such as a transistor and so forth formed and burying an insulating film into the groove. In Japanese Unexamined Patent Application Publication No. 2011-66067, an element isolation film of an STI structure is formed in addition to this groove. The above-mentioned groove is formed deeper than the element isolation film.

SUMMARY

When the impurity region that extends in the depth direction in the substrate is formed by forming the trench in the substrate and diagonally implanting the impurity into the trench, there is the possibility that the impurity may be implanted into a side face of a groove such as a groove for element isolation and so forth impurity implantation into the side face of which is not desired. The inventors of the present invention studied to reduce the above-mentioned possibility. Other subjects and novel features of the present invention will become apparent from description of the specification and the appended drawings.

According to one embodiment, an element isolation trench is formed in a substrate. The element isolation trench is formed along each side of a polygon in a planar view. Further, a first trench is formed in the substrate. The first trench extends in a direction different from that of any side of the element isolation trench. Then, a first-conductivity type region is formed on/over a part located on the side of an end of the first trench in the substrate.

According to another embodiment, a first trench and a second trench are formed in a substrate. The first trench extends in a first direction in the planar view. The second trench extends in a second direction that is different from the first direction in the planar view. A first-conductivity type region is formed on/over a part located on the side of the end of the first trench in the substrate and a second-conductivity type region is formed on/over a part located on the side of an end of the second trench in the substrate.

According to a still another embodiment, a first trench is formed in a substrate. The first trench extends in a first direction in the planar view. A first-conductivity type region is formed on/over a part located on the side of one end of the first trench in the substrate and a second-conductivity type region is formed on/over a part located on the side of the other end of the first trench in the substrate.

According to the above-mentioned embodiments, when the impurity region that extends in the depth direction in the substrate is formed by forming the trench in the substrate and diagonally implanting the impurity into the trench, it becomes possible to suppress implantation of the impurity into the side face of the groove impurity implantation into which is not desired.

BRIEF DESCRIPTION OF THE DRAWINGS

FIGS. 2A and 2B are diagrams illustrating one example of a first element region, in which FIG. 2A is an enlarged diagram of a region surrounded by a dotted line a in FIG. 1 and FIG. 2B is a plan view of the first element region.

FIGS. 6A and 6B are sectional diagrams illustrating one example of the semiconductor device manufacturing method, in which FIG. 6A corresponds to FIG. 1 and FIG. 6B corresponds to FIG. 2B.

FIGS. 7A and 7B are sectional diagrams illustrating one example of the semiconductor device manufacturing method, in which FIG. 7A corresponds to FIG. 1 and FIG. 7B corresponds to FIG. 2B.

FIGS. 8A and 8B are diagrams illustrating one example of a bipolar transistor that the semiconductor device according to a second embodiment includes, in which FIG. 8A is a sectional diagram of the bipolar transistor and FIG. 8B is a plan view of the bipolar transistor.

FIGS. 9A and 9B are diagrams illustrating one example of the bipolar transistor that the semiconductor device according to a third embodiment includes, in which FIG. 9A is sectional diagram of the bipolar transistor and FIG. 9B is a plan view of the bipolar transistor.

DETAILED DESCRIPTION

In the following, preferred embodiments of the present invention will be described with reference to the accompanying drawings. Incidentally, in all drawings, the same signs are assigned to the same constitutional elements and description thereof is appropriately omitted.

First Embodiment

Figure 1:
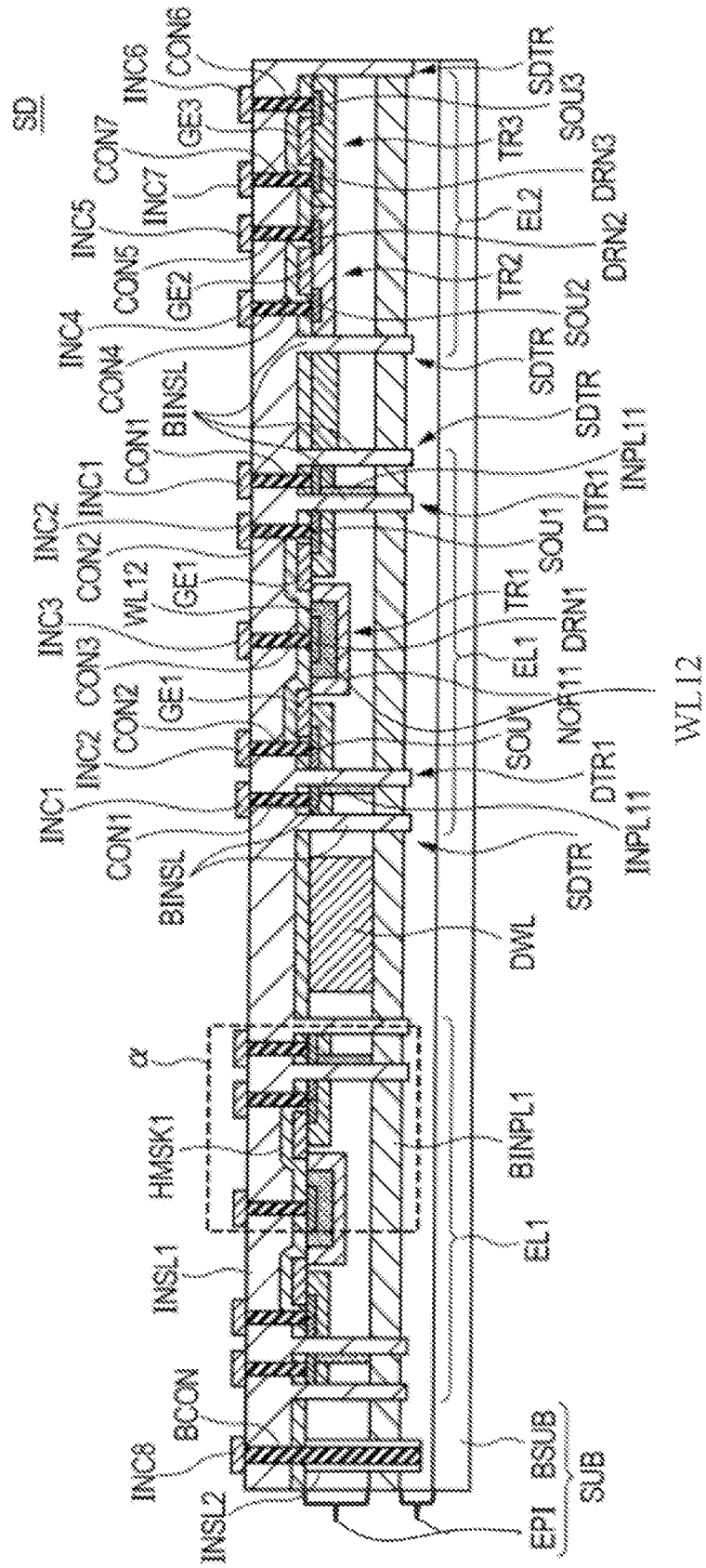
FIG. 1 is a sectional diagram illustrating one example of a configuration of a semiconductor device according to a first embodiment.

FIG. 1 is a sectional diagram illustrating one example of a configuration of a semiconductor device SD according to a first embodiment. The semiconductor device SD according to the present embodiment is formed by using a substrate SUB. The substrate SUB is of the type that an epitaxial layer EPI of a semiconductor (for example, silicon) has been grown on/over a base substrate BSUB configured by a bulk semiconductor (for example, silicon). The base substrate BSUB and the epitaxial layer EPI are of the same conductivity type (a second-conductivity type: for example, a p-type). An impurity concentration of the base substrate BSUB is higher than an impurity concentration of the epitaxial layer EPI. Then, a first buried layer BINPL1 of a conductivity type (a first-conductivity type: for example, an n-type) that is different from that of the epitaxial layer EPI is formed in the epitaxial layer EPI. The first buried layer BINPL1 is separated from the base substrate BSUB. Since the first buried layer BINPL1 is formed for the purpose of epitaxially growing the epitaxial layer EPI, the first buried layer BINPL1 is formed throughout the entire surface of the substrate SUB.

Incidentally, in the following, description will be made on a case where the first-conductivity type is the n-type and the second-conductivity type is the p-type. However, the first-conductivity type may be the p-type and the second-conductivity type may be the n-type.

Transistors TR2 and TR3 that configure a logic circuit and a transistor TR1 for power control are formed in the epitaxial layer EPI.

The transistor TR2 is an n-type low voltage resistance transistor and includes a gate electrode GE2, a source SOU2 and a drain DRN2. The transistor TR3 is a p-type low voltage resistance transistor and includes a gate electrode GE3, a source SOU3 and a drain DRN3. The transistors TR2 and TR3 configure a CMOS transistor. Incidentally, gate insulating films (not illustrated) are formed under/below the gate electrodes GE2 and GE3.

The transistor TR1 is a horizontal transistor for power control and is made higher in voltage resistant than the transistors TR2 and TR3. The transistor TR1 includes a gate electrode GE1, a source SOU1 and a drain DRN1. A distance between the drain DRN1 and the gate electrode GE1 is made longer than a distance between the source SOU1 and the gate electrode GE1. Thereby, the voltage resistance between the drain DRN1 and the gate electrode GE1 is increased. A gate insulating film (not illustrated) is formed under/below the gate electrode GE1. The gate insulating film has a film thickness that is the same as or thicker than those of the gate insulating films of the transistors TR2 and TR3. Incidentally, though described later by using FIG. 2, a buried insulating film STI is formed between the drain DRN1 and the gate electrode GE1. In addition, the drain DRN1 includes an n-type well WL12 and an n-type offset region NOF11 formed around the n-type well WL12.

Then, an insulating film HMSK1 and an inter-layer insulating film INSL1 are formed on/over the substrate SUB. The insulating film HMSK1 is, for example, a silicon nitride film and the inter-layer insulating film INSL1 is, for example, a silicon oxide film. Contacts CON1 CON2, CON3, CON4, CON5, CON6 and CON7 are buried in the insulating film HMSK1 and the inter-layer insulating film INSL1. The contact CON2 is coupled to the source SOU1 of the transistor TR1 and the contact CON3 is coupled to the drain DRN1 of the transistor TR1. The contact CON4 is coupled to the source SOU2 of the transistor TR2 and the contact CON5 is coupled to the drain DRN2 of the transistor TR2. The contact CON6 is coupled to the source SOU3 of the transistor TR3 and the contact CON7 is coupled to the drain DRN3 of the transistor TR3. In addition, though not illustrated in the drawing, a contact to be coupled to the gate electrode GE1, a contact to be coupled to the gate electrode GE2, a contact to be coupled to the gate electrode GE3 and a contact to be coupled to a deep well DWL (described later) are also buried in the insulating film HMSK1 and the inter-layer insulating film INSL1.

Wirings INC1, INC2, INC3, INC4, INC5, INC6 and INC7 are formed on/over the inter-layer insulating film INSL1. The wirings INC2, INC3, INC4, INC5, INC6 and INC7 are formed by using a metal such as, for example, aluminum and so forth and are respectively coupled to the contacts CON2, CON3, CON4, CON5, CON6 and CON7. Incidentally, also a wiring (not illustrated) to be coupled to each gate electrode and a wiring to be coupled to the deep well DWL are formed on/over the inter-layer insulating film INSL1.

The transistor TR1 is formed in a first element region EL1 and the transistors TR2 and TR3 are formed in a second element region EL2. Describing in detail, one transistor TR1 is formed in the first element region EL1. On the other hand, a plurality of sets of the transistors TR2 and TR3 are formed in the second element region EL2. Incidentally, for simplification of the drawing, only one set of the transistors TR2 and TR3 is illustrated in the second element region EL2 in FIG. 1. Then, each of the first element region EL1 and the second element region EL2 is surrounded by an element isolation trench SDTR. Although the element isolation trench SDTR passes through the first buried layer BINPL1, the element isolation trench SDTR does not reach the base substrate BSUB. Alternatively, the element isolation trench SDTR may reach the base substrate BSUB. Then, a buried insulating film BINSL is buried in the element isolation trench SDTR. In the example illustrated in FIG. 1, the buried insulating film BINSL configures a part of the inter-layer insulating film INSL1 on/over the substrate SUB.

Incidentally, further, the n-type deep well DWL and a buried contact BCON are formed in the substrate SUB. A bottom face of the deep well DWL reaches the first buried layer BINPL1 and affords a fixed potential to the first buried layer BINPL1. The buried contact BCON is a contact buried in the substrate SUB and passes through the first buried layer BINPL1. Therefore, the fixed potential is afforded to each of the epitaxial layer EPI and the base substrate BSUB located lower than the first buried layer BINPL1 via the buried contact BCON.

Incidentally, although a groove into which the buried contact BCON is to be buried is formed in the same process as a coupling hole into which, for example, the contact CON2 is to be buried, the groove may be formed in an independent process. An insulating film (for example, a thermal oxide film or a TEOS (tetraethyl orthosilicate) film INSL2 is formed on an inner surface of the groove. Thereby, the buried contact BCON is insulated from the first buried layer BINPL1 and part of the epitaxial layer EPI located higher than the first buried layer BINPL1. In addition, the buried contact BCON is formed in the same process as the contact CON2 and so forth. Therefore, the buried contact BCON also passes through the inter-layer insulating film INSL1 and the insulating film HMSK1 and an upper end of the buried contact BCON is coupled to a wiring INC8 on/over the inter-layer insulating film INSL1.

A first trench DTR1 is formed in the epitaxial layer EP1. Since the first trench DTR1 is formed in the same process as the element isolation trench SDTR, the bottom face of the first trench DTR1 is located lower (on the base substrate BSUB side) than the first buried layer BINPL1. In addition, the buried insulating film BINSL is buried in the first trench DTR1.

Then, a first-conductivity region INPL11 (a first first-conductivity type region) is formed in a part of a region that configures a side face of the first trench DTR1 in the epitaxial layer EPI. The first-conductivity type region INPL11 is coupled to the first buried layer BINPL1. In other words, the first-conductivity type region INPL11 electrically pulls the first buried layer BINPL1 up to a surface layer of the epitaxial layer EP1.

Figure 2A:
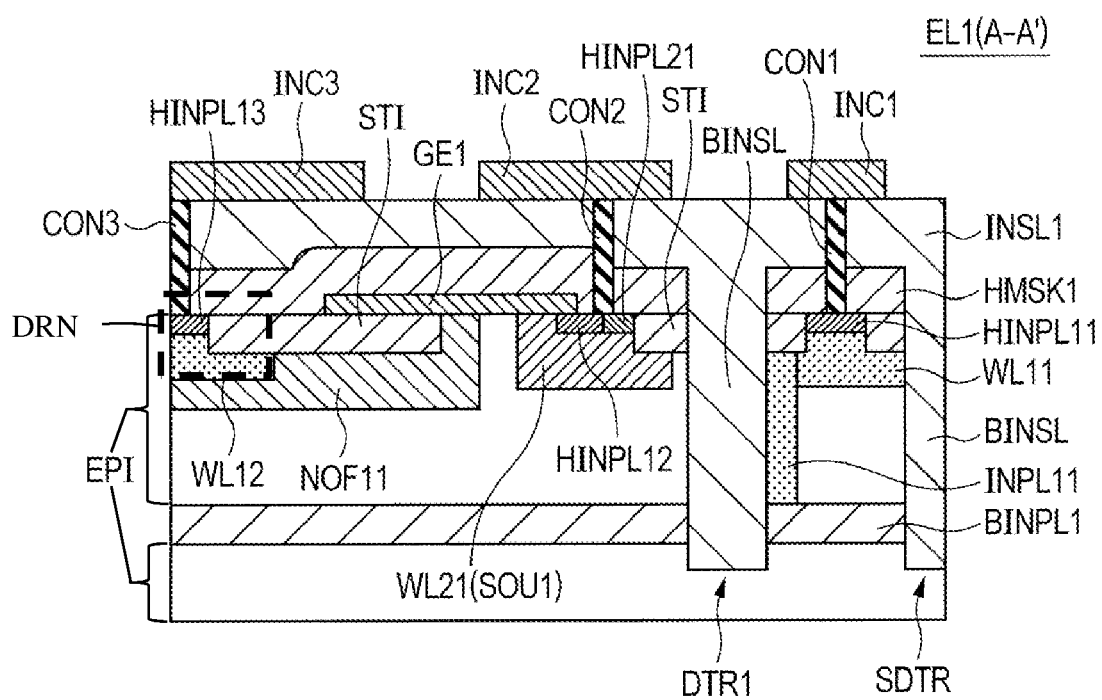
Figure 2B:
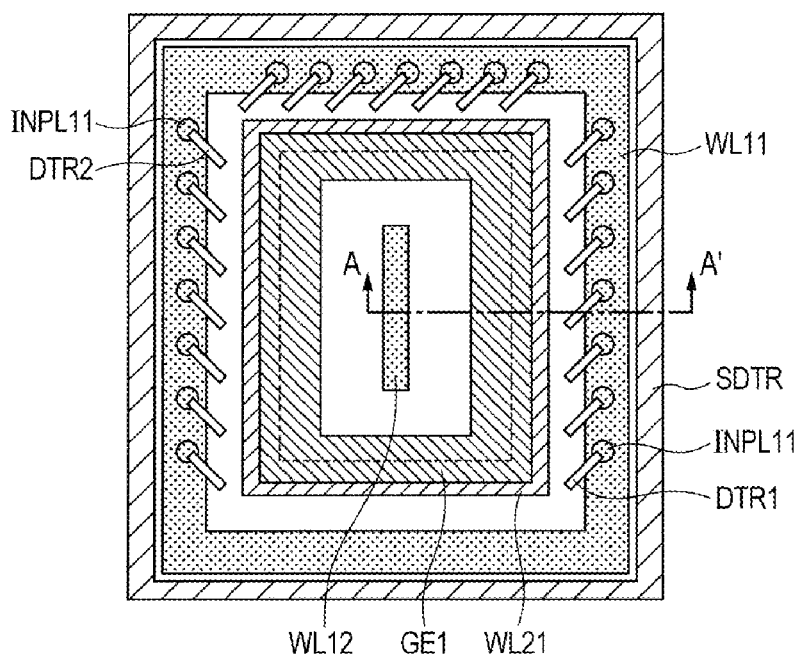

FIG. 2A is an enlarged diagram illustrating one example of a region surrounded by a dotted-line α in FIG. 1. FIG. 2B is a plan view illustrating one example of a first element region EL1. Incidentally, FIG. 2A corresponds to a section taken along the A-A' line in FIG. 2B. In addition, in FIG. 2B, illustration of some constitutional elements of the transistor TR1 is omitted.

As illustrated in FIG. 2A, the high voltage-resistance transistor TR1 is formed in the first element region EL1. The transistor TR1 includes the drain DRN1, the gate electrode GE1 and the source SOU1 as described above. The drain DRN1 includes an n-type well WL12 and an n-type high concentration region HINPL13 formed on/over a surface layer of the n-type well WL12. The high concentration region HINPL13 is coupled to a contact CON3. In addition, an n-type offset region NOF11 is formed around the n-type well WL12. In other words, the n-type well WL12 is formed in a surface layer of the offset region NOF11.

On the other hand, the source SOU1 includes an n-type high concentration region HINPL12. The high concentration region HINPL12 is formed in a surface layer of a p-type well WL21. In addition, a p-type high concentration region HINPL21 is formed in a part of the p-type well WL21 that is located next to the high concentration region HINPL12. Then, the contact CON2 is coupled to the high concentration regions HINPL12 and HINPL21.

In addition, the buried insulating film STI of the STI structure is formed between the gate electrode GE1 and the drain DRN1. The above-mentioned offset region NOF11 is formed in front of a lower surface of the buried insulating film STI.

As illustrated in FIG. 2B, the gate electrode GE1 surrounds the n-type well WL12 of the drain DRN1 and the p-type well WL21 surrounds the gate electrode GE1. In addition, the element isolation trench SDTR is formed along each side of a polygon (a rectangle in the example in FIG. 2B) and surrounds the p-type well WL21. On other words, the transistor TR1 is located inside of the element isolation trench SDTR.

Then, a plurality of the first trenches DTR1 are formed in a region between the p-type well WL21 and the element isolation trench SDTR. All of the plurality of first trenches DTR1 extend in a direction that is different from that of any side of the element isolation trench SDTR in the planar view. In the example illustrated in FIG. 2B, the first trench DTR1 extends at an angle of at least about 30 degrees and not more than about 60 degrees (preferably, an angle of at least about 43 degrees and not more than about 47 degrees) relative to each side of the element isolation trench SDTR. Then, the first-conductivity type region INPL11 is formed on/over a part located on the side of an end of the first trench DTR1 in the epitaxial layer EPI. This is because the first-conductivity type region INPL11 is formed by diagonally implanting impurity ions into the epitaxial layer EPI through the first trench DTR1 as described in detail later. Then, a direction that the impurity ions are implanted is a direction that the first trench DTR1 extends in the planar view. Therefore, the impurity ions are hardly implanted into a part located on a side face of the element isolation trench SDTR in the epitaxial layer EPI.

Incidentally, in the example illustrated in FIG. 2B, the first trench DTR1 is not superposed on the p-type well WL21. Then, the plurality of first trenches DTR1 are arranged along two sides (a right side and an upper side in the example in FIG. 2B) that are located with one corner interposed in four sides of the element isolation trench SDTR. The first-conductivity type regions INPL11 are formed (on/over parts located) on the sides of same-side ends (upper right-side ends in the example in FIG. 2B) of the respective first trenches DTR1.

In addition, further, a plurality of second trenches DTR2 are formed in an inside region of the element isolation trench SDTR. The second trenches DTR2 are arranged along one side along which the first trenches DTR1 are not formed in the four sides of the element isolation trench SDTR. All of the second trenches DTR2 extend in a direction (a second direction) different from that of the first trenches DTR1. In the example illustrated in FIG. 2B, the second direction is almost orthogonal to the direction (a first direction) that the first trenches DTR1 extend. Then, each first-conductivity type region INPL11 is formed also on the side of one end (the end closer to the element isolation trench SDTR in the example illustrated in FIG. 2B) of each second trench DTR2. By arranging the above-mentioned elements in this way, it becomes possible to separate all of the first-conductivity type regions INPL11 from the p-type well WL21 in comparison with a case where the first trench DTR1 is formed in place of the second trench DTR2.

Then, an n-type well WL11 is formed inside of the element isolation trench SDTR. The n-type well WL11 surrounds the p-type well WL21. As illustrated in FIG. 2A, an upper part of the first-conductivity type region INPL11 is linked with the n-type well WL11 and an n-type high concentration region HINPL11 is formed on/over a surface layer of the n-type well WL11. The n-type high concentration region HINPL11 is coupled to a first contact CON1. The first contact CON1 couples the first buried layer BINPL1 to a wiring INC1 on/over the inter-layer insulating film INSL1 via the n-type high concentration region HINPL11, the n-type well WL11 and the first-conductivity type region INPL11. Incidentally, in the example illustrated in FIG. 2B, the n-type well WL11 is formed throughout the entire inner periphery of the element isolation trench SDTR. However, the n-type well WL11 may be formed only in a region that is superposed on the first trench DTR1.

Incidentally, both of the first trench DTR1 and the element isolation trench SDTR are superposed on the buried insulating film ST1. In other words, the first trench DTR1 and the element isolation trench SDTR pass through the buried insulating film STI. However, some first trenches DTR1 and a part of the element isolation trench SDTR may not be superposed on the buried insulating film ST1.

Figure 3A:
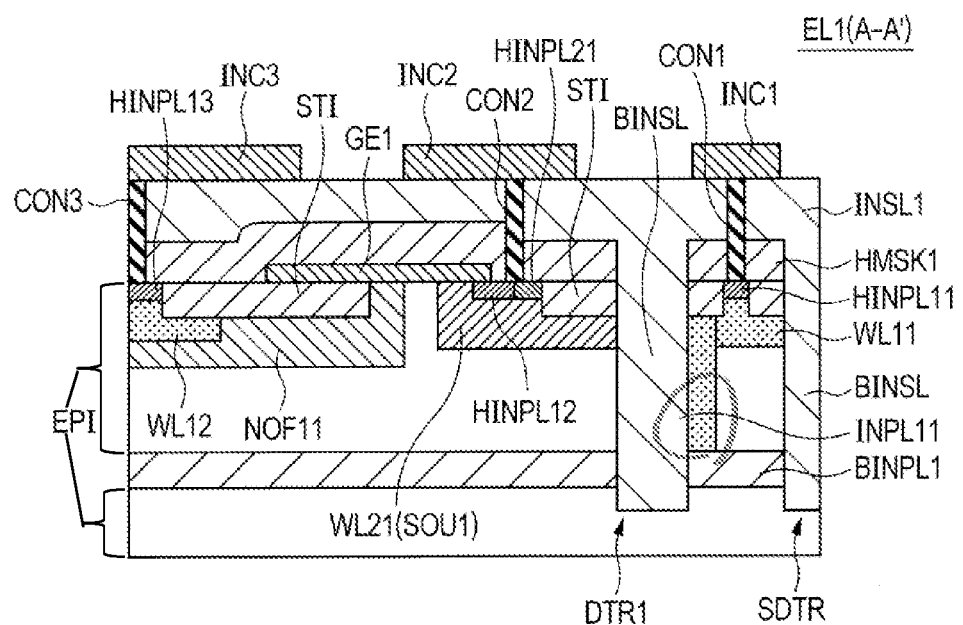
FIGS. 3A and 3B are diagrams illustrating one example of a transistor according to a modified example of the embodiment in FIG. 2, in which FIG. 3A corresponds to FIG. 2A and FIG. 3B corresponds to FIG. 2B.
Figure 3B:
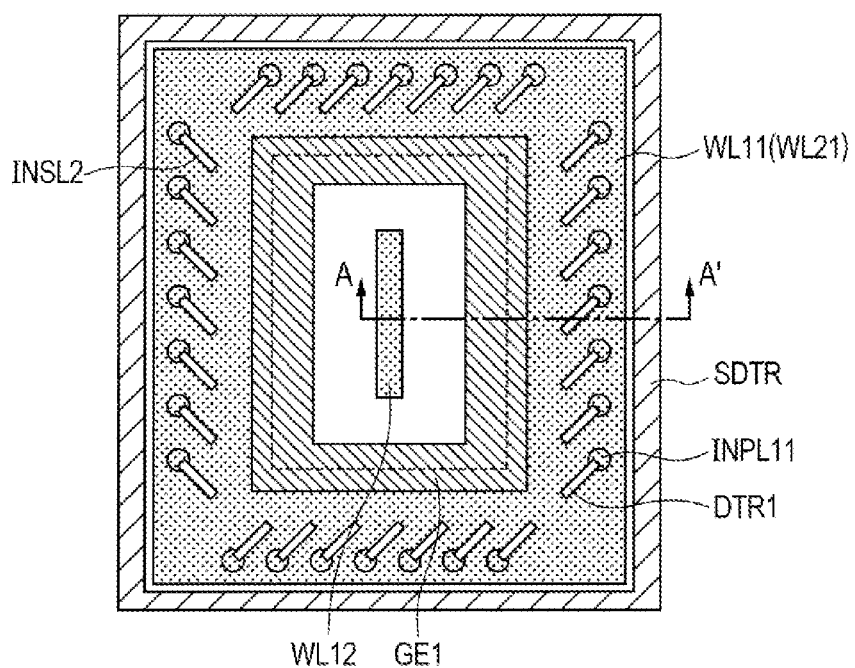

FIGS. 3A and 3B are diagrams illustrating one example of a configuration of the transistor TR3 according to a modified example of the embodiment in FIG. 2 and respectively correspond to FIGS. 2A and 2B. The transistor TR3 according to this modified example is a p-channel type transistor and the n-type well WL11, the n-type well WL12, the offset region NOF11 and the n-type high concentration regions HINPL 12, HINPL13 and HINPL21 in FIG. 2 are formed as elements having the conductivity type opposite to that of the elements in FIG. 2. Incidentally, in FIG. 3, for easy understanding, the same symbols as those in FIG. 2 are assigned to the same elements. Then, a well corresponding to the p-type well WL21 in FIG. 2 is integrated with the well WL11 so converted to the p-type.

FIG. 4 to FIG. 7 are sectional diagrams each illustrating one example of a manufacturing method for the semiconductor device SD. FIG. 4A, FIG. 5A, FIG. 6A and FIG. 7A correspond to FIG. 1 and FIG. 4B, FIG. 5B, FIG. 6B and FIG. 7B correspond to FIG. 2A.

Figure 4A:
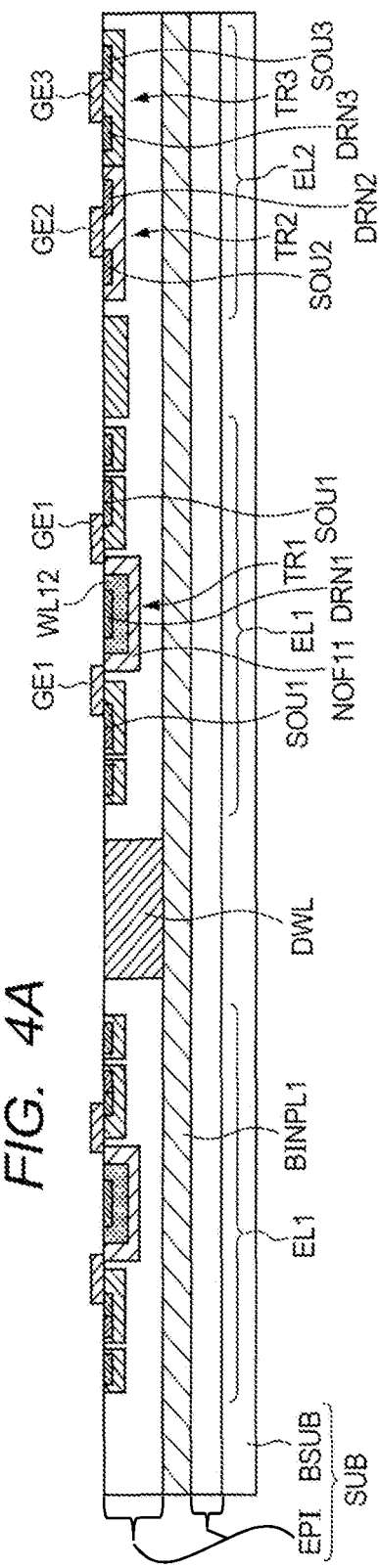
FIGS. 4A and 4B are sectional diagrams illustrating one example of a semiconductor device manufacturing method, in which FIG. 4A corresponds to FIG. 1 and FIG. 4B corresponds to FIG. 2B.
Figure 4B:
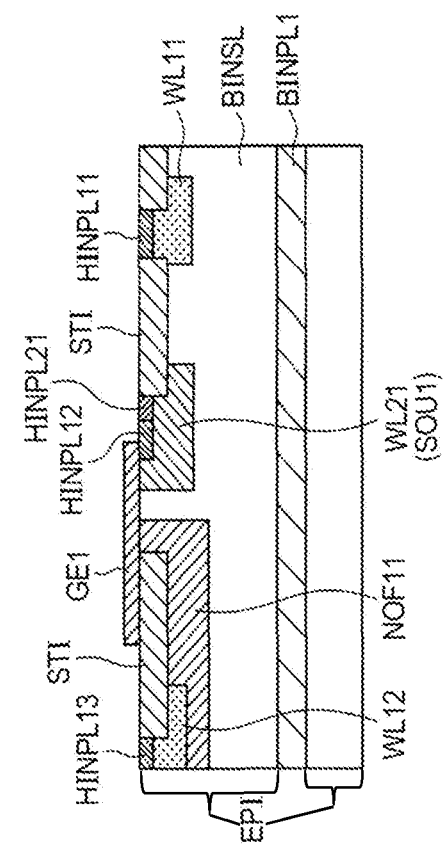

First, as illustrated in FIGS. 4A and 4B, the base substrate BSUB is prepared. Then, the epitaxial layer EPI is formed on/over the base substrate BSUB. In this case, formation of the epitaxial layer EPI is suspended and the first buried layer BINPL1 is formed by ion implantation and so forth. Then, after the first buried layer BINPL1 has been thermally diffused, the epitaxial layer EPI is again formed. Then, various wells (including the deep well DWL) and the offset region NOF11 are formed in the epitaxial layer EPI by using, for example, an ion implantation method and so forth. Then, a groove is formed in the epitaxial layer EPI and an insulating film, for example, a silicon oxide film and so forth is buried into this groove. Thereby, the buried insulating film STI is formed. Incidentally, as the timing of formation of the various wells and the offset region NOF11, the various wells and the offset region NOF11 may be formed after formation of the buried insulating film STI.

Then, the gate insulating films of the transistors TR1, TR2 and TR3 are formed. Then, a material (for example, a polysilicon film and so forth) of the gate electrode is deposited and the film so deposited is selectively removed. Thereby, the gate electrodes GE1, GE2 and GE3 are formed. Then, the respective high concentration regions (for example, the high concentration regions HINPL11, HINPL12, HINPL13, HINPL21 and so forth) are formed in the epitaxial layer EPI by using, for example, the ion implantation method and so forth.

Incidentally, there are cases when sidewalls are formed on side faces of the gate electrodes GE1, GE2 and GE3. In this case, each high concentration region is formed after formation of the sidewalls.

Figure 5A:
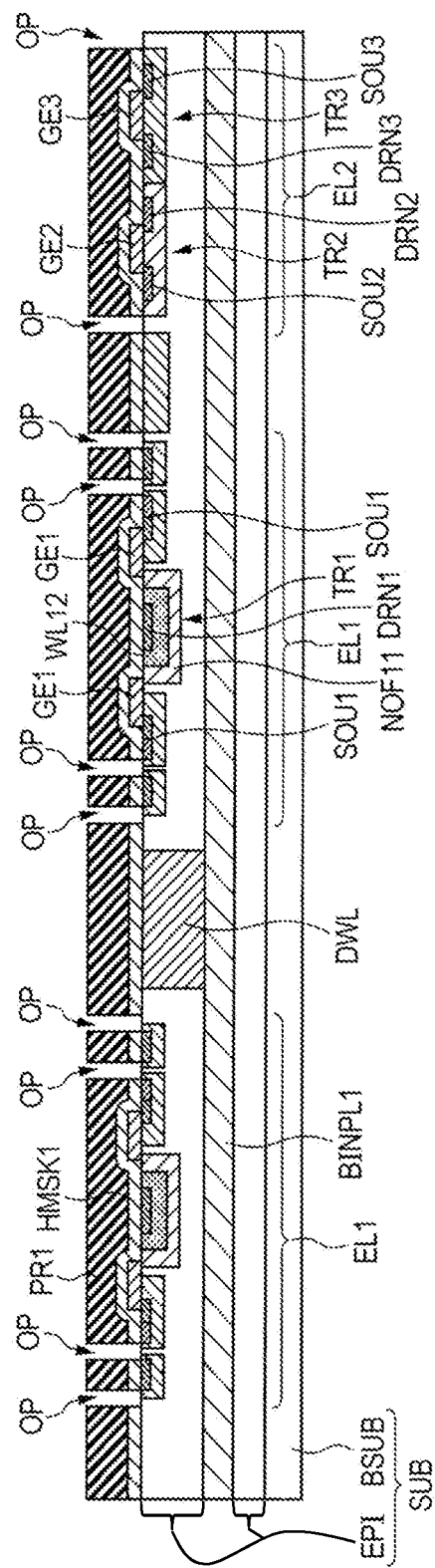
FIGS. 5A and 5B are sectional diagrams illustrating one example of the semiconductor device manufacturing method, in which FIG. 5A corresponds to FIG. 1 and FIG. 5B corresponds to FIG. 2B.
Figure 5B:
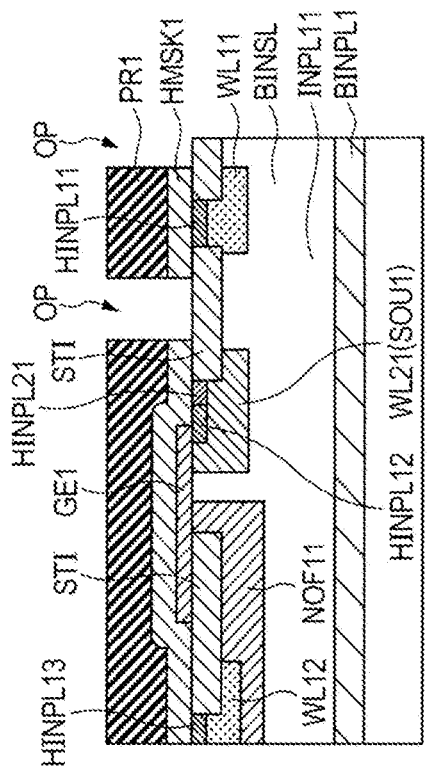

Then, as illustrated in FIGS. 5A and 5B, the insulating film HMSK1 is formed on/over the epitaxial layer EPI. Then, a resist pattern PR1 is formed on/over the insulating film HMSK1. The resist pattern PR1 includes openings in regions where the first trenches DTR1 and the element isolation trench SDTR are to be formed. Then, the insulating film HMSK1 is etched by using the resist pattern PR1 as a mask. Thereby, the openings are formed in regions of the insulating film HMSK1 where the first trenches DTR1 and the element isolation trench SDTR are to be formed.

Then, as illustrated in FIGS. 6A and 6B, the buried insulating film STI and the epitaxial layer EPI are etched by using the insulating film HMSK1 as a mask. Thereby, the first trenches DTR1 and the element isolation trench SDTR are formed. Thereafter, when the resist pattern PR1 is left behind, the resist pattern PR1 is removed.

Then, as illustrated in FIGS. 7A and 7B, ions of an n-type impurity are diagonally implanted into the epitaxial layer EPI. In this occasion, a direction that the impurity ions are to be implanted is set to a direction that the first trenches DTR1 extend. Thereby, the first-conductivity type region INPL11 is formed on/over a part located on the side of one end of the first trench DTR1 in the epitaxial layer EPI. On the other hand, any part of the element isolation trench SDTR is not parallel with the first trench DTR1. Therefore, the impurity ions are hardly implanted into a part located on a side face of the element isolation trench SDTR in the epitaxial layer EPI. Then, when the first-conductivity type region INPL11 is to be formed, an angle of ion implantation relative to the substrate SUB is changed in the middle of formation of the first-conductivity type region INPL11. Here, ion implantation is defined by a tilt angle (an angle relative to a normal direction of the base substrate BSUB) and a twist angle (a rotation angle with a notch in the base substrate BSUB set as a reference). By performing ion implantation in this way, the first-conductivity type regions INPL11 are formed on the side of the end concerned of the first trench DTR1 and on the side of the end concerned of the second trench DTR2.

Thereafter, as shown in FIG. 1, the inter-layer insulating film INSL1 is formed. In this case, a part of the inter-layer insulating film INSL1 is buried into the element isolation trench SDTR and the first trench DTR1 and serves as the buried insulating film BINSL. In this case, although a void is formed in each of the element isolation trench SDTR and the first trench DTR1, this void is plugged with the inter-layer insulating film INSL1 (the buried insulating film BINSL1) and is not exposed still in post-processing, it does not affect the quality of the semiconductor device SD.

Then, a resist pattern (not illustrated) is formed on the inter-layer insulating film INSL1 and the inter-layer insulating film INSL1 is etched by using the resist pattern as a mask. Thereby, coupling holes are formed in the inter-layer insulating film INSL1 in order to form the respective contacts. Incidentally, in this process, as shown in FIG. 1, the coupling hole is also formed in a region of the inter-layer insulating film INSL1 where the buried contact BCON is to be formed. This coupling hole reaches down to the bottom of a groove formed in the epitaxial layer EPI. Then, a metal such as W and so forth is buried into each of these coupling holes. Thereby, each contact and the buried contact BCON are formed. In this case, a side face of the coupling hole into which the buried contact BCON is to be buried is thermally oxidized in advance.

Thereafter, a metal film (for example, Al and so forth) is formed on/over the inter-layer insulating film INSL1. Then, the metal film is selectively removed. Thereby, each wiring is formed.

As described above, according to the present embodiment, any part of the element isolation trench SDTR is not parallel with the first trench DTR1. Therefore, the impurity ions are hardly implanted into the part of the epitaxial layer EPI that is located on the side face of the element isolation trench SDTR. Accordingly, it is possible to selectively form the first-conductivity type region INPL11 only on the side of the end concerned of the first trench DTR1.

Incidentally, it is not necessary for the semiconductor device SD to include all of the elements described in the present embodiment. In addition, the first trench DTR1 and the element isolation trench SDTR, and the buried insulating film BINSL may be formed before the insulating film HMSK1 is formed (for example, before the gate insulating films of the transistors TR1, TR2 and TR3 are formed). In this case, the buried insulating film BINSL is formed as an insulating film separated from the inter-layer insulating film INSL1.

In addition, the second direction that the second trench DTR2 extends is different from the first direction that the first trench DTR1 extends. By making the first and second directions mutually different in this way, it is possible to suppress formation of a not-intended impurity region on the side face of the second trench DTR2 when the first-conductivity type region INPL11 is to be formed relative to the first trench DTR1. This advantageous effect is maximally exhibited when the first direction is orthogonal to the second direction.

Second Embodiment

Figure 8A:
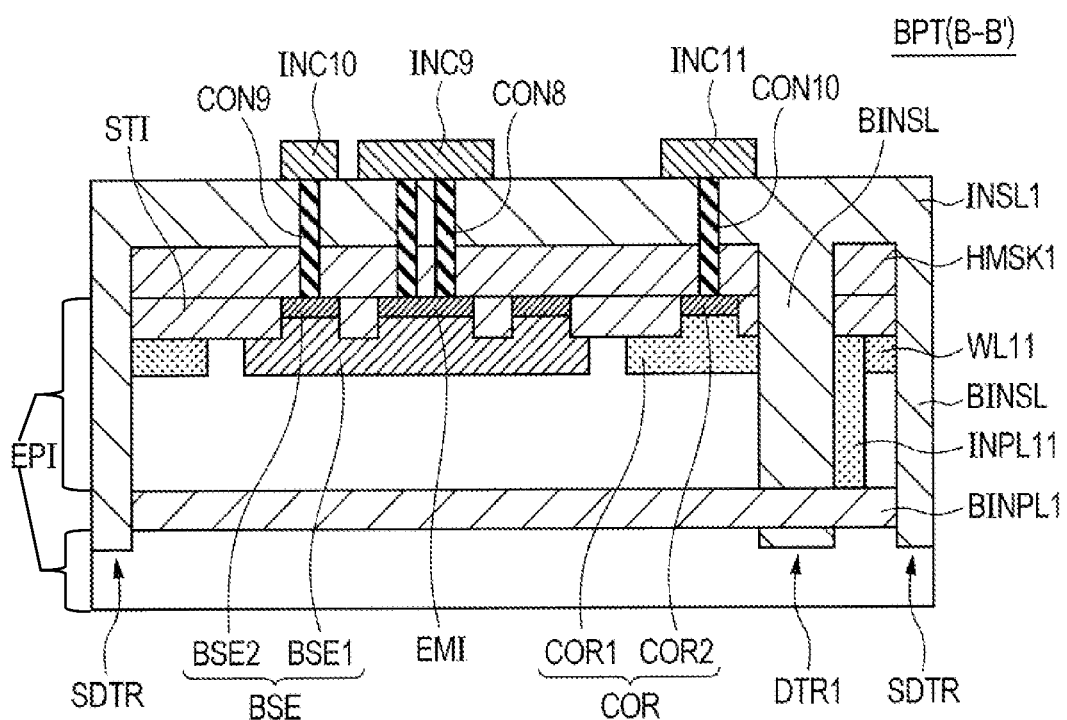
Figure 8B:
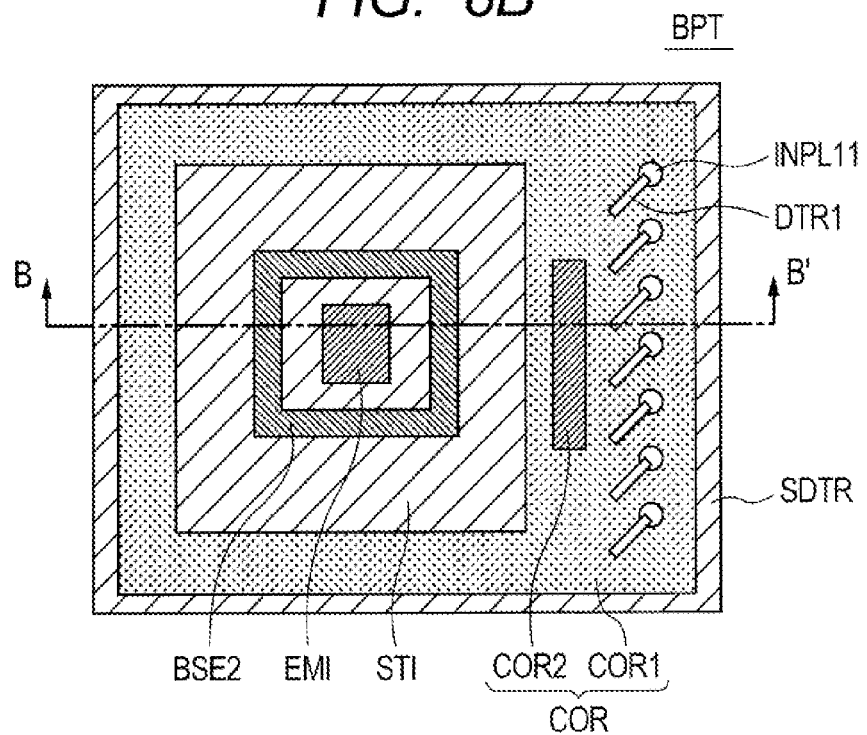

FIG. 8A is a sectional diagram illustrating one example of a bipolar transistor BPT that the semiconductor device SD according to a second embodiment includes. FIG. 8B is a plan view of the bipolar transistor illustrated in FIG. 8A. FIG. 8A corresponds to a section taken along the B-B' line in FIG. 8B.

The bipolar transistor BPT is an npn-type transistor and is formed by using the substrate SUB. The configuration of the substrate SUB is the same as that in the first embodiment including the configurations of the first trench DTR1, the element isolation trench SDTR, the first-conductivity type region INPL11, the n-type well WL11, the high concentration region HINPL11 and so forth. Incidentally, in the example illustrated in FIGS. 8A and 8B, the first trenches DTR1 are arranged only in a region along one side of the element isolation trench SDTR. However, the number of the first trenches DTR1 to be arranged and the arrangement thereof are not limited to the example illustrated in FIGS. 8A and 8B.

An emitter EM1, a base BSE and a collector COR are formed in a region of the epitaxial layer EPI surrounded by the element isolation trench SDTR. The base BSE includes a p-type well BSE1 and a high concentration p-type impurity layer BSE2. The p-type impurity layer BSE2 is formed on/over part of a surface layer of the p-type well BSE1. The emitter EM1 is a high concentration n-type impurity layer and is located on/over a part (for example, a central part of the p-type well BSE1 in the planar view) of a surface layer of the p-type well BSE1. The collector COR includes an n-type well COR1 and a high concentration n-type impurity layer COR2. Incidentally, in the planer view, the p-type impurity layer BSE2 surrounds the emitter EM1. Then, the n-type well COR1 of the collector COR surrounds the p-type impurity layer BSE2. The buried insulating film STI is formed between the emitter EM1 and the p-type impurity layer BSE2 and the buried insulating film STI is also formed between the p-type impurity layer BSE2 and the n-type impurity layer COR2.

Then, the p-type impurity layer BSE2 of the base BSE is coupled to a base electrode INC10 via a contact CON9 and the emitter EM1 is coupled to an emitter electrode INC9 via a contact CON8. In addition, the n-type impurity layer COR2 of the collector COR is coupled to a collector electrode INC11 via a contact CON10.

The manufacturing method for the semiconductor device SD according to the present embodiment is the same as the manufacturing method for the semiconductor device SD described in the first embodiment.

Also in the example illustrated in FIGS. 8A and 8B, any part of the element isolation trench SDTR is not parallel with the first trench DTR1. Accordingly, it is possible to selectively form the first-conductivity type region INPL11 only on the side of the end concerned of the first trench DTR1.

Third Embodiment

Figure 9A:
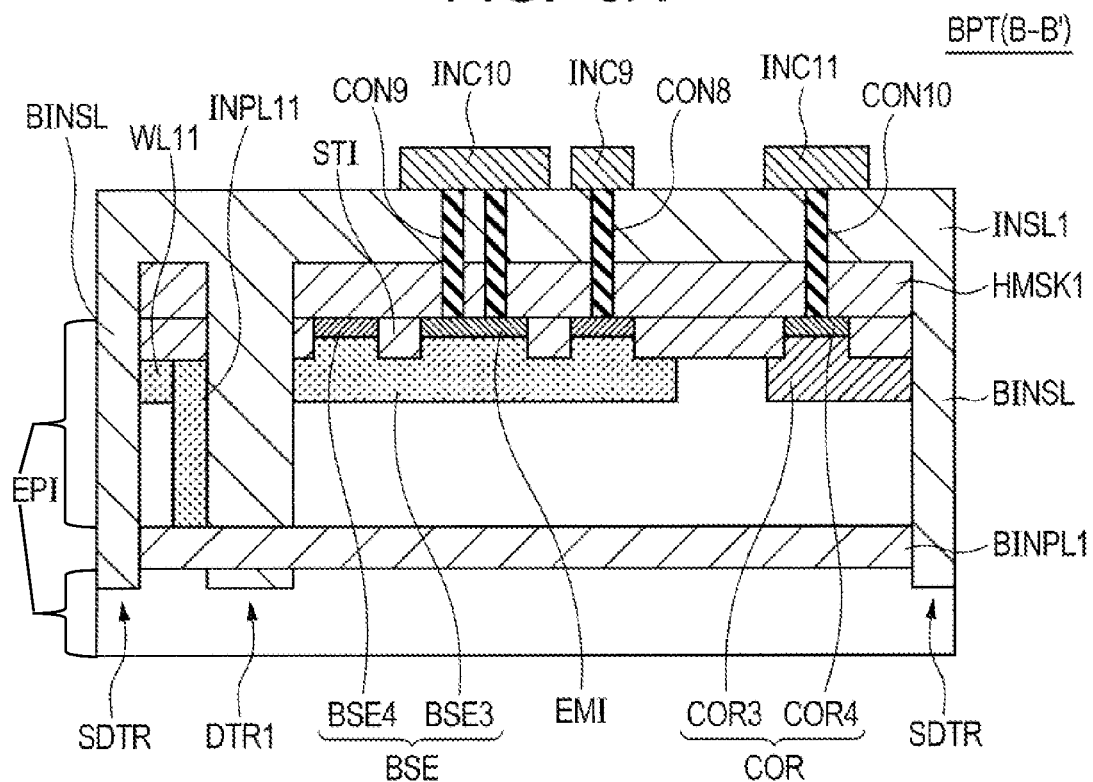
Figure 9B:
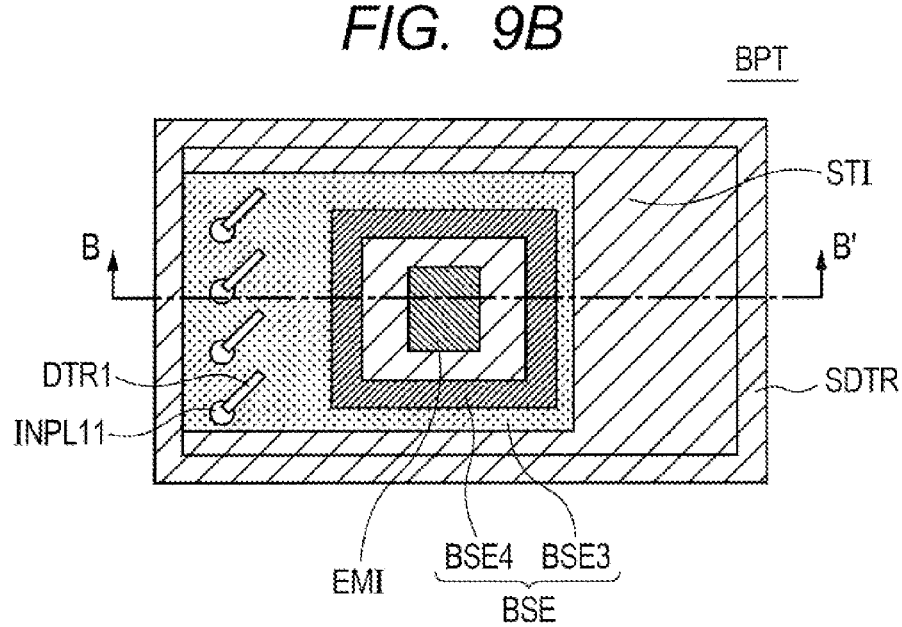

FIG. 9A is a sectional diagram illustrating one example of the bipolar transistor BPT that the semiconductor device SD according to a third embodiment includes and FIG. 9B is a plan view of the bipolar transistor BPT illustrated in FIG. 9A. FIG. 9A corresponds to the section taken along the B-B' line in FIG. 9B. The configuration of the semiconductor device SD according to the present embodiment is the same as that of the semiconductor device SD according to the second embodiment, excepting a point that the bipolar transistor BPT is a pnp-type transistor.

Describing in detail, an n-type well BSE3 is formed in place of the p-type well BSE1 in the second embodiment and a high concentration n-type impurity layer BSE4 is formed in place of the p-type impurity layer BSE2. In addition, the emitter EM1 is a high concentration p-type impurity layer formed on/over a part of a surface layer of the n-type well BSE3. Then, a p-type well COR3 is formed in place of the n-type well COR1 in the second embodiment and a high concentration p-type impurity layer COR4 is formed in place of the n-type impurity layer COR2.

Incidentally, the n-type well BSE3 is formed down to a part that is in contact with one side of the element isolation trench SDTR. Then, the n-type well BSE3 also serves as the n-type well WL11 in the second embodiment.

Also according to the present embodiment, any part of the element isolation trench SDTR is not parallel with the first trench DTR1. Therefore, it is possible to selectively form the first-conductivity type region INPL11 only on the side of the end concerned of the first trench DTR1.

Fourth Embodiment

Figure 10:
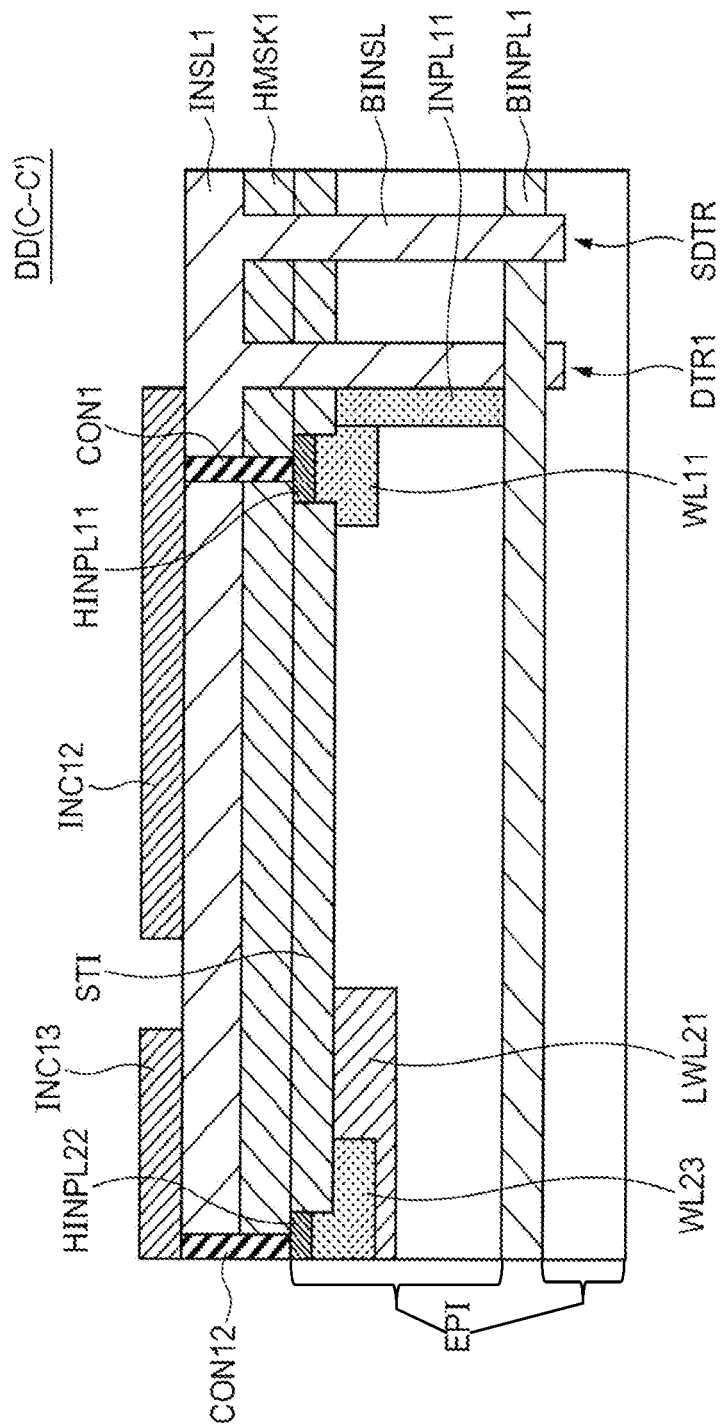
FIG. 10 is a sectional diagram illustrating one example of a diode that the semiconductor device according to a fourth embodiment includes.
Figure 11:
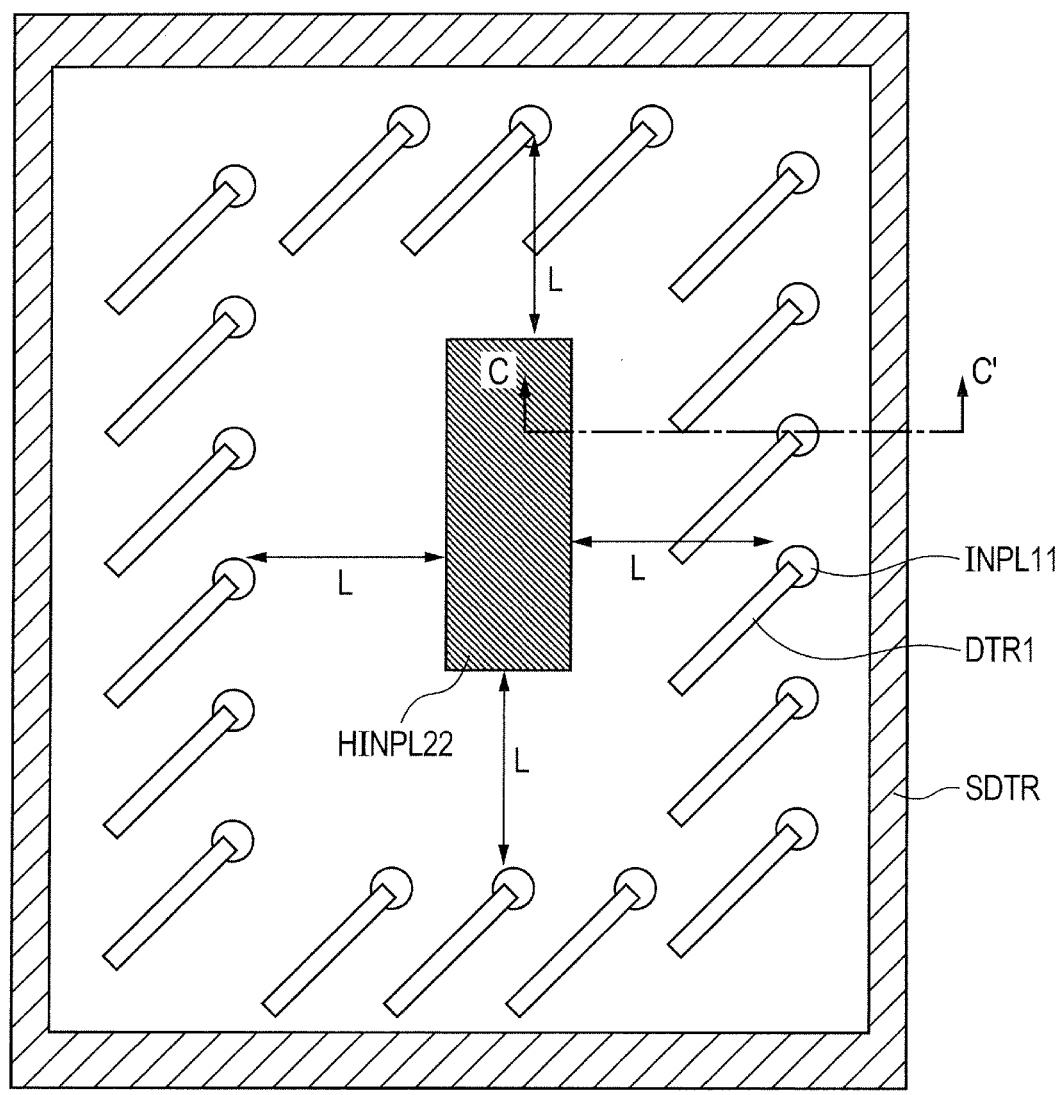
FIG. 11 is a plan view illustrating one example of the diode illustrated in FIG. 10.

FIG. 10 is a sectional diagram illustrating one example of a diode DD that the semiconductor device SD according to a fourth embodiment includes. FIG. 11 is a plan view of the diode DD illustrated in FIG. 10. Incidentally, FIG. 10 corresponds to a section taken along the C-C' line in FIG. 11.

The diode DD is formed by using the substrate SUB. The configuration of the substrate SUB is the same as that in the first embodiment including the configurations of the first trench DTR1, the element isolation trench SDTR, the first-conductivity type region INPL11, the n-type well WL11, the high concentration region HINPL11 and so forth.

A cathode of the diode DD is configured by the first buried layer BINPL1 and is coupled to the first contact CON1 via the first-conductivity type region INPL11, the n-type well WL11, the high concentration region HINPL 11 and so forth. In the example illustrated in FIG. 10, the first contact CON1 electrically couples the first buried layer BINPL1 to a cathode electrode INC12. The cathode electrode INC12 is formed on/over a surface layer of the inter-layer insulating film INSL1 and is formed in the same process as, for example, the wiring INC4 and so forth in the first embodiment.

An anode of the diode DD is configured by a p-type well WL23 (a first second-conductivity type region) and a low concentration p-type well LWL21 and is coupled to a second contact CON12 via a p-type high concentration region HINPL22 formed on/over a surface layer of the p-type well WL23. The second contact CON12 electrically couples the p-type well WL23 to an anode electrode INC13. The anode electrode INC13 is formed on/over the surface layer of the inter-layer insulating film INSL1 and is formed in the same process as, for example, the wiring INC4 and so forth in the first embodiment.

Incidentally, the plurality of first trenches DTR1 and the plurality of first-conductivity type regions INPL11 are arranged so as to surround a high concentration region HINPL22. Describing in detail, the plurality of first trenches DTR1 are formed along the respective sides of the element isolation trench SDTR. Then, the first-conductivity type region INPL11 is formed on the side of one end of each of the plurality of first trenches DTR1. Incidentally, in the example illustrated in FIG. 10, all of the first-conductivity type regions INPL11 are formed respectively on the sides of the same-side ends (for example, the upper right-side ends) of every two ends of the first trenches DTR1.

The high concentration region HINPL22 is rectangular. Then, it is preferable that the plurality of first trenches DTR1 be arranged such that minimum high concentration region HINPL22-to-first-conductivity type region INPL11 distances L become the same as one another among over half of the first-conductivity type regions INPL11 (preferably, among all of the first-conductivity type regions INPL11).

The manufacturing method for the semiconductor device SD according to the present embodiment is the same as that in the first embodiment.

Also according to the present embodiment, any part of the element isolation trench SDTR is not parallel with the first trench DTR1. Therefore, it is possible to selectively form the first-conductivity type region INPL11 only on the side of the end concerned of the first trench DTR1.

Fifth Embodiment

Figure 12:
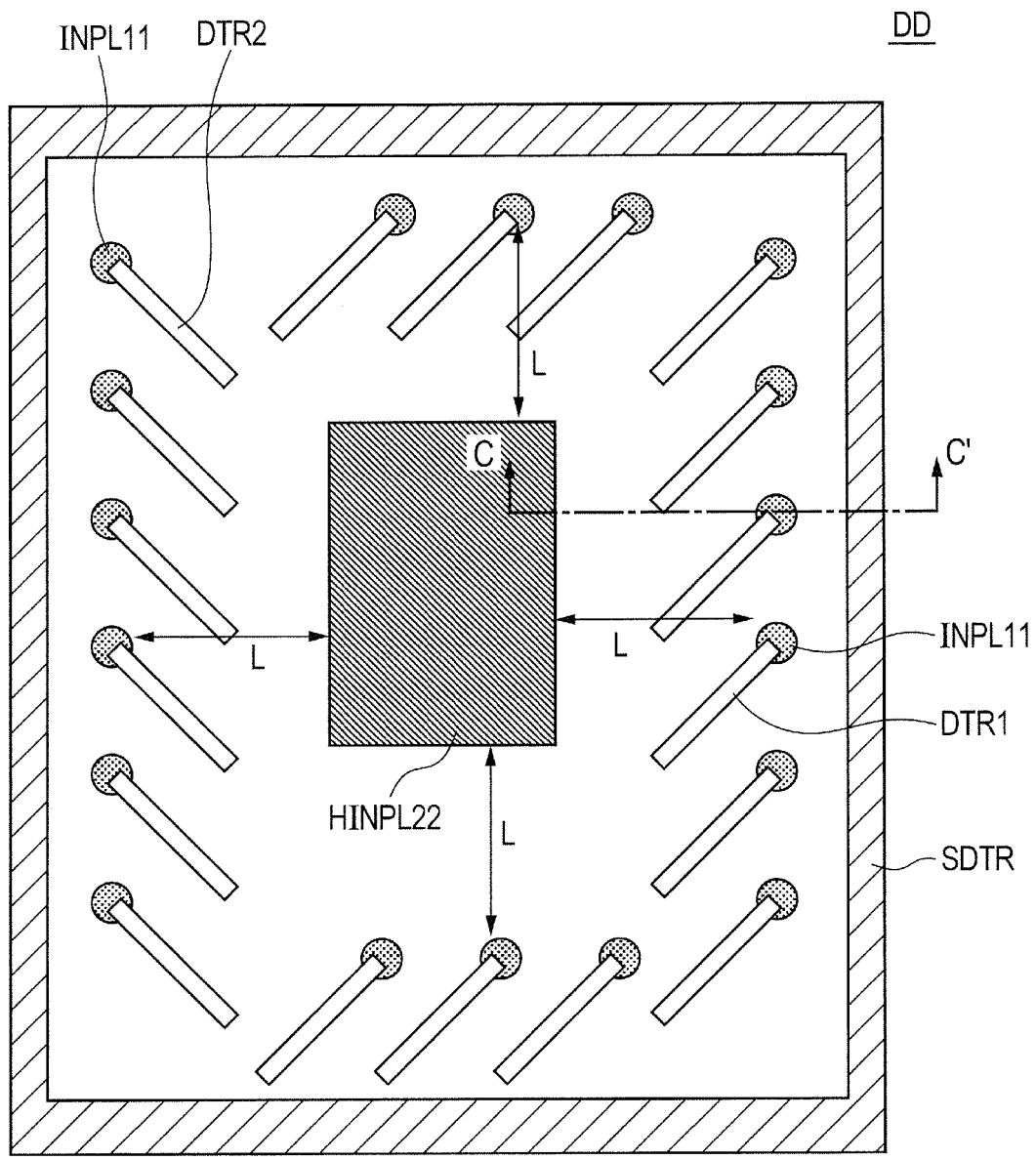
FIG. 12 is a plan view illustrating one example of the semiconductor device according to a fifth embodiment.

FIG. 12 is a plan view illustrating one example of the semiconductor device SD according to a fifth embodiment and corresponds to FIG. 11 in the fourth embodiment. The semiconductor device SD according to the present embodiment is the same as the semiconductor device SD according to the fourth embodiment excepting the following points.

First, the plurality of first trenches DTR1 are arranged along three sides of the element isolation trench SDTR. Then, the plurality of second trenches DTR2 are arranged along the remaining one side of the element isolation trench SDTR. Then, as in the case in the first embodiment, the first-conductivity type region INPL11 is formed also on the side of the end concerned of each second trench DTR2.

The manufacturing method for the semiconductor device SD according to the present embodiment is the same as the manufacturing method for the semiconductor device SD according to the first embodiment.

Figure 13:
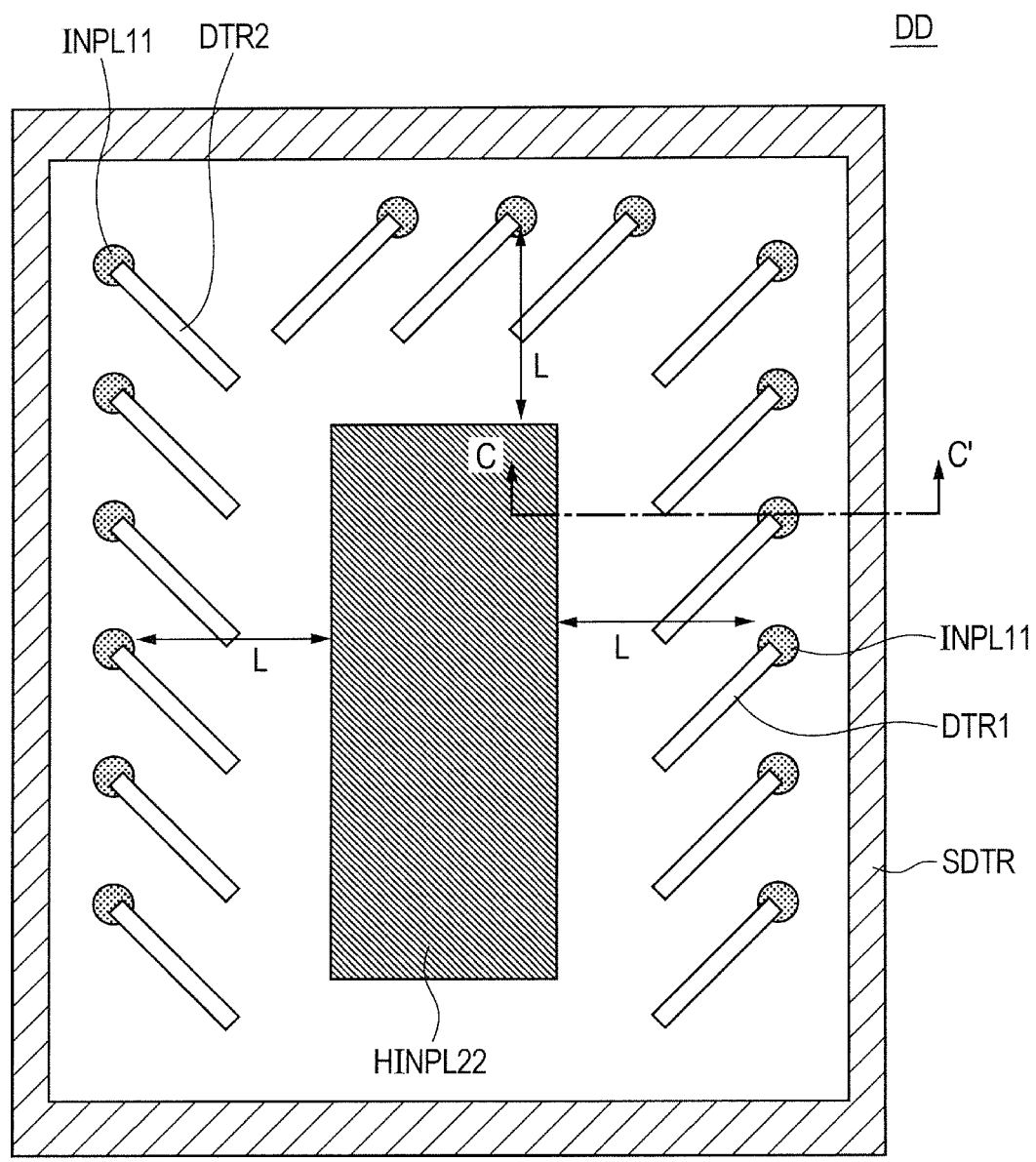
FIG. 13 is a diagram illustrating a modified example of the embodiment in FIG. 12.
Figure 14:
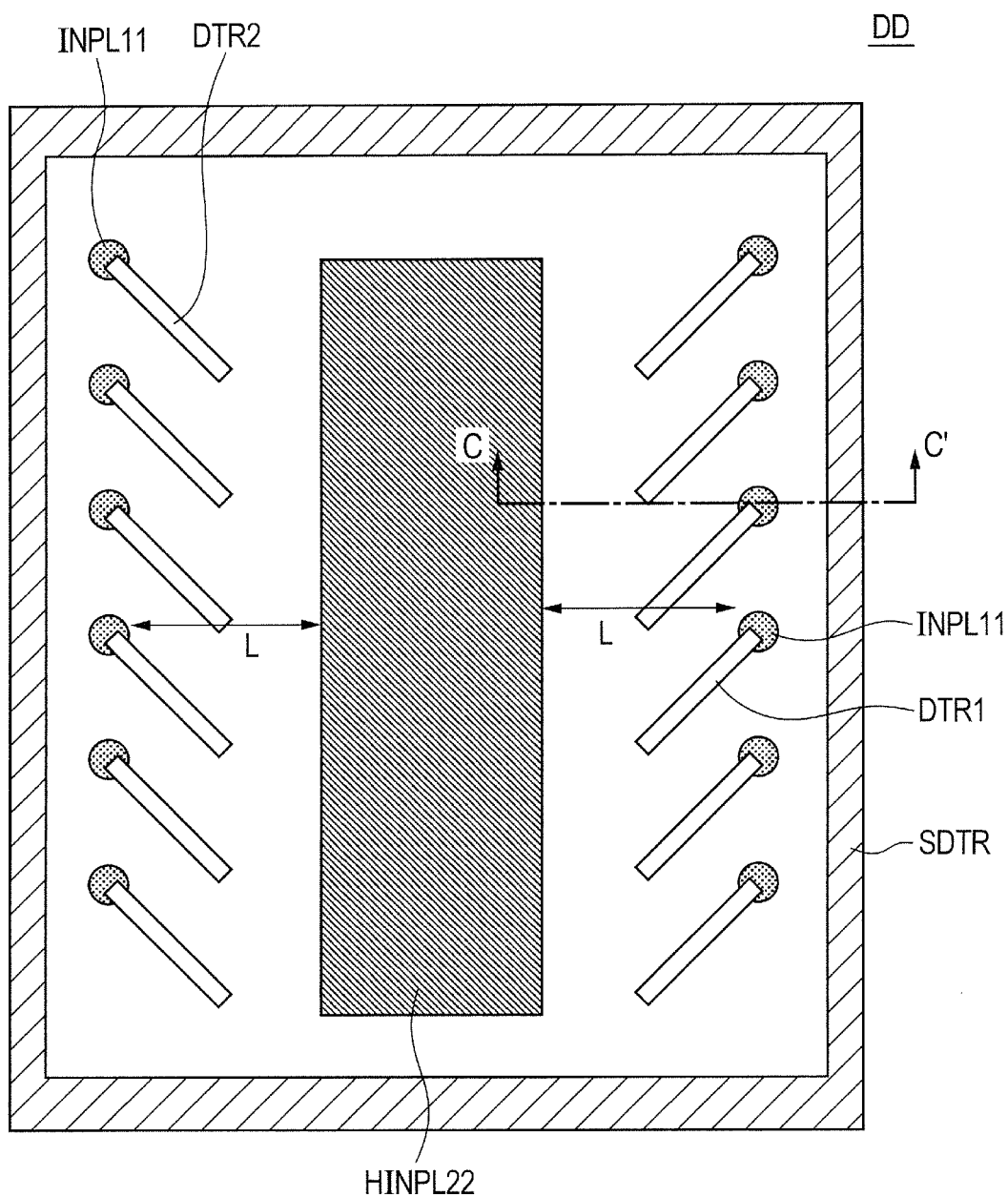
FIG. 14 is a diagram illustrating a modified example of the embodiment in FIG. 12.

Incidentally, the first trenches DTR1 may be arranged along only two mutually intersecting sides of the four sides of the element isolation trench SDTR as illustrated in FIG. 13. In addition, the first trenches DTR1 may be arranged along only one side of the element isolation trench SDTR as illustrated in FIG. 14. In addition, in the example illustrated in FIG. 2B relevant to the first embodiment, the arrangement of the first trenches DTR1 may be made in the same way as the arrangement illustrated in either FIG. 12 or FIG. 13. Further, in the example illustrated in FIG. 3B relevant to the first embodiment, the arrangement of the first trenches DTR1 may be made in the same way as the arrangement in the example illustrated in any one of FIGS. 11 to 13.

Also according to the present embodiment, any part of the element isolation trench SDTR is not parallel with the first trench DTR1. Therefore, it is possible to selectively form the first-conductivity type regions INPL11 only on the side of the end concerned of the first trench DTR1 and on the side of the end concerned of the second trench DTR2. In addition, since the second trenches DTR2 extend in the direction different from that of the first trenches DTR1, it is possible to bring the first-conductivity type regions INPL11 closer to the element isolation trench SDTR along mutually facing sides of the four sides of the element isolation trench SDTR. Thereby, it is possible to reduce an exclusive area of the diode DD.

In addition, the second direction that the second trenches DTR2 extend is different from the first direction that the first trenches DTR1 extend. By making the first and second directions mutually different in this way, it is possible to suppress formation of the not-intended impurity region on the side face of the second trench DTR2 when the first-conductivity type region INPL11 is to be formed relative to the first trench DTR1. This advantageous effect is maximally exhibited when the first direction is orthogonal to the second direction.

Sixth Embodiment

Figure 15:
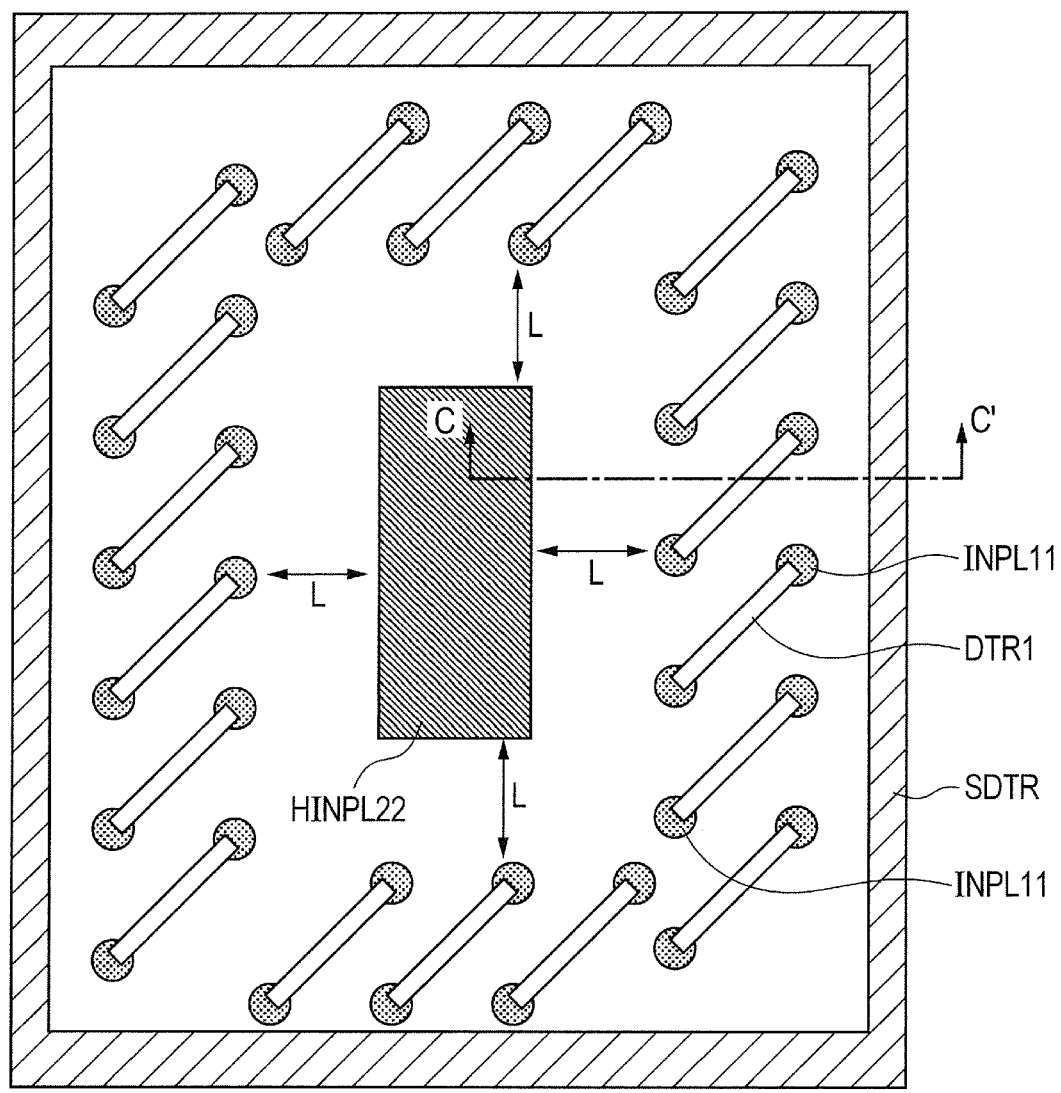
FIG. 15 is a plan view illustrating one example of the semiconductor device according to a sixth embodiment.

FIG. 15 is a plan view illustrating one example of the semiconductor device SD according to a sixth embodiment and corresponds to FIG. 11 in the fourth embodiment. The configuration of the semiconductor device SD according to the present embodiment is the same as the configuration of the semiconductor device SD according to the fourth embodiment, excepting a point that the first-conductivity type regions INPL11 are formed on the sides of the both ends of each first trench DTR1. The manufacturing method for the semiconductor device SD according to the present embodiment is the same as the manufacturing method for the semiconductor device SD according to the fourth embodiment, excepting a point that the substrate SUB is turned about 180 degrees while ion implantation for formation of the first-conductivity type regions INPL11 is being performed.

Also according to the present embodiment, the same advantageous effect as that by the fourth embodiment is obtained. In addition, since it is possible to increase the number of the first-conductivity type regions INPL11 without increasing the number of the first trenches DTR1, it is possible to reduce a parasitic resistance on the cathode side (or the anode side) of the diode DD without increasing the number of the first trenches DTR1.

Seventh Embodiment

Figure 16:
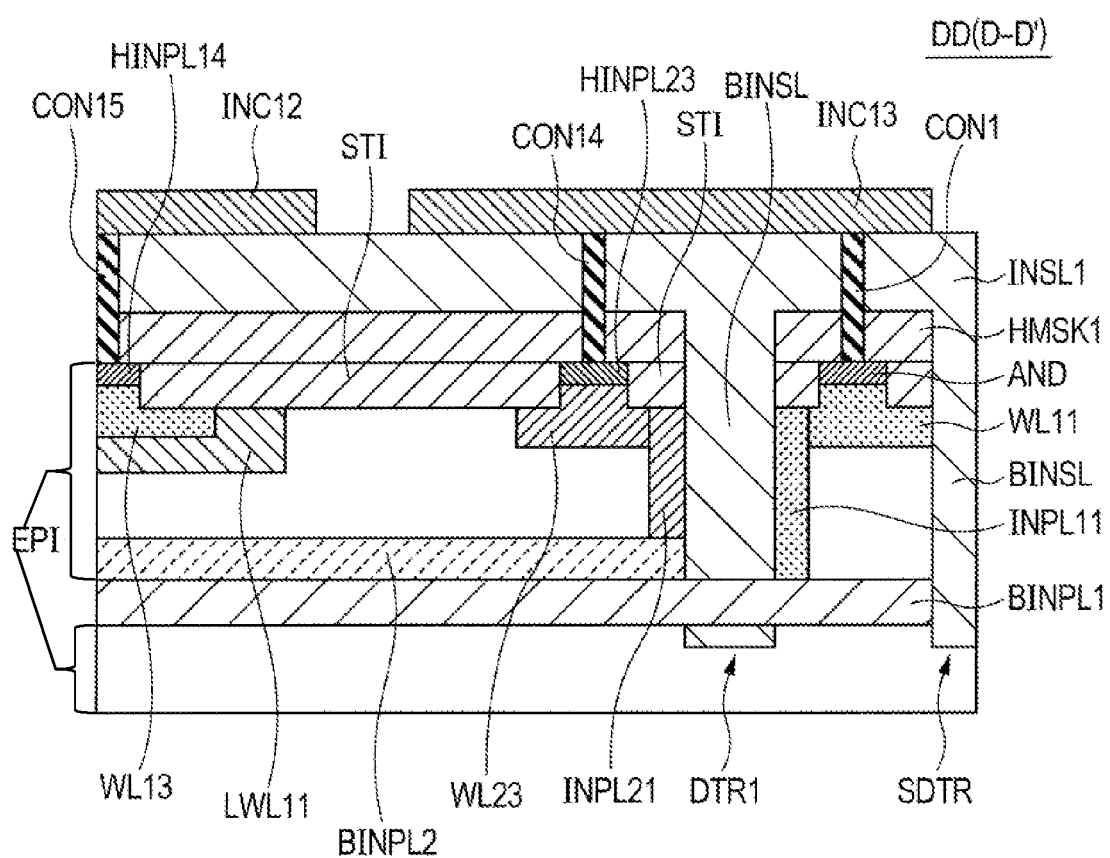
FIG. 16 is a sectional diagram illustrating one example of a configuration of the diode that the semiconductor device according to a seventh embodiment includes.
Figure 17:
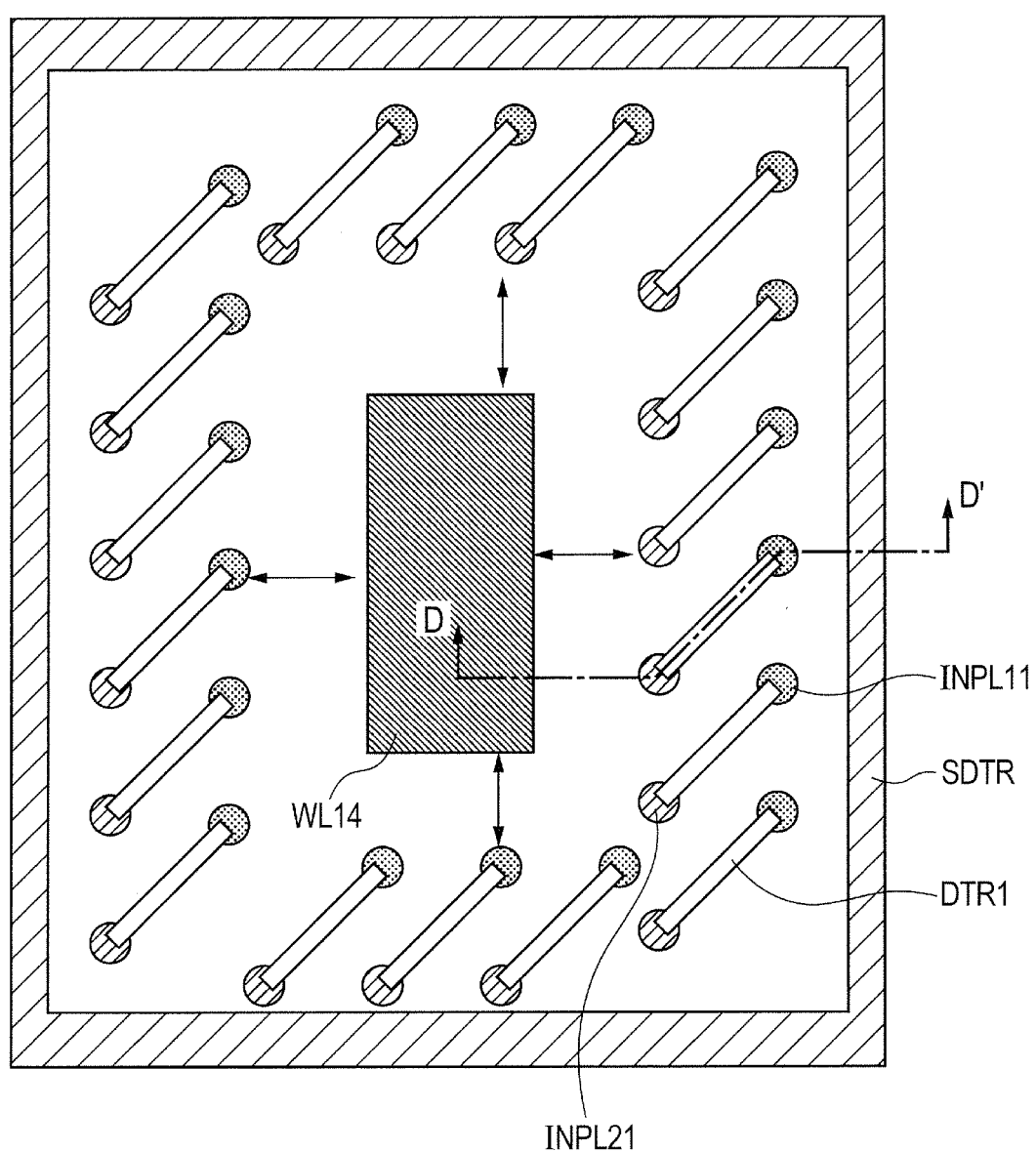
FIG. 17 is a plan view illustrating one example of the diode illustrated in FIG. 16.

FIG. 16 is a sectional diagram illustrating one example of a configuration of the diode DD that the semiconductor device SD according to a seventh embodiment includes. FIG. 17 is a plan view of the diode DD illustrated in FIG. 16. Incidentally, FIG. 16 is the sectional diagram taken along the D-D' line in FIG. 17.

First, as illustrated in FIG. 16, the cathode of the diode DD is configured not by the buried insulating film BINSL1 but by a low concentration n-type well LWL11 and an n-type well WL13 formed in the surface layer of the epitaxial layer EPI. An n-type high concentration region HINPL14 is formed on/over a part of a surface layer of the n-type well WL13. The n-type high concentration region HINPL14 is coupled to the cathode electrode INC12 via a contact CON15.

On the other hand, the anode of the diode DD is configured by a second n-type buried layer BINPL2 buried in the epitaxial layer EPI. The second buried BINPL2 is located higher than the first buried layer BINPL1 in the epitaxial layer EPI and is formed throughout the entire surface below, for example, the n-type well LWL11 and its surroundings in the planar view.

The first-conductivity type region INPL11 is formed on the side of one end of the two ends of the first trench DTR1. On the other the hand, a second-conductivity type region INPL21 (a second second-conductivity type region) is formed on the side of the other end of the first trench DTR1. A lower part of the second-conductivity type region INPL21 is coupled to a buried insulating film BINSL2 and an upper part of the second-conductivity type region INPL21 is coupled to the p-type well WL23. A p-type high concentration region HINPL23 is formed on/over a surface layer of the p-type well WL23. The high concentration region HINPL23 is coupled to the anode electrode INC13 via a third contact CON14. Incidentally, in the example illustrated in FIG. 16, the first contact CON1 is coupled to the anode electrode INC13 in addition.

Then, as illustrated in FIG. 17, the first-conductivity type regions INPL11 are formed on the sides of the mutually same-side ends (in the example illustrated in FIG. 17, the upper right-side ends) of the plurality of first trenches DTR1 and the second-conductivity type regions INPL21 are formed on the sides of the opposite-side ends (in the example illustrated in FIG. 17, lower left-side ends) of the plurality of first trenches DTR1.

The manufacturing method for the semiconductor device SD according to the present embodiment is the same as the manufacturing method for the semiconductor device SD according the fourth embodiment, excepting the following points. First, a process for forming the second buried layer BINPL12, for example, by using the ion implantation method and so forth is included. This process is performed, for example, after the epitaxial layer EPI has been formed and before the buried insulating film STI is formed. In addition, the second-conductivity type region INPL21 is formed by performing ion implantation for forming the first-conductivity type region INPL11, then turning the substrate SUB about 180 degrees and thereafter diagonally implanting ions of a p-type impurity into the substrate SUB.

Figure 18:
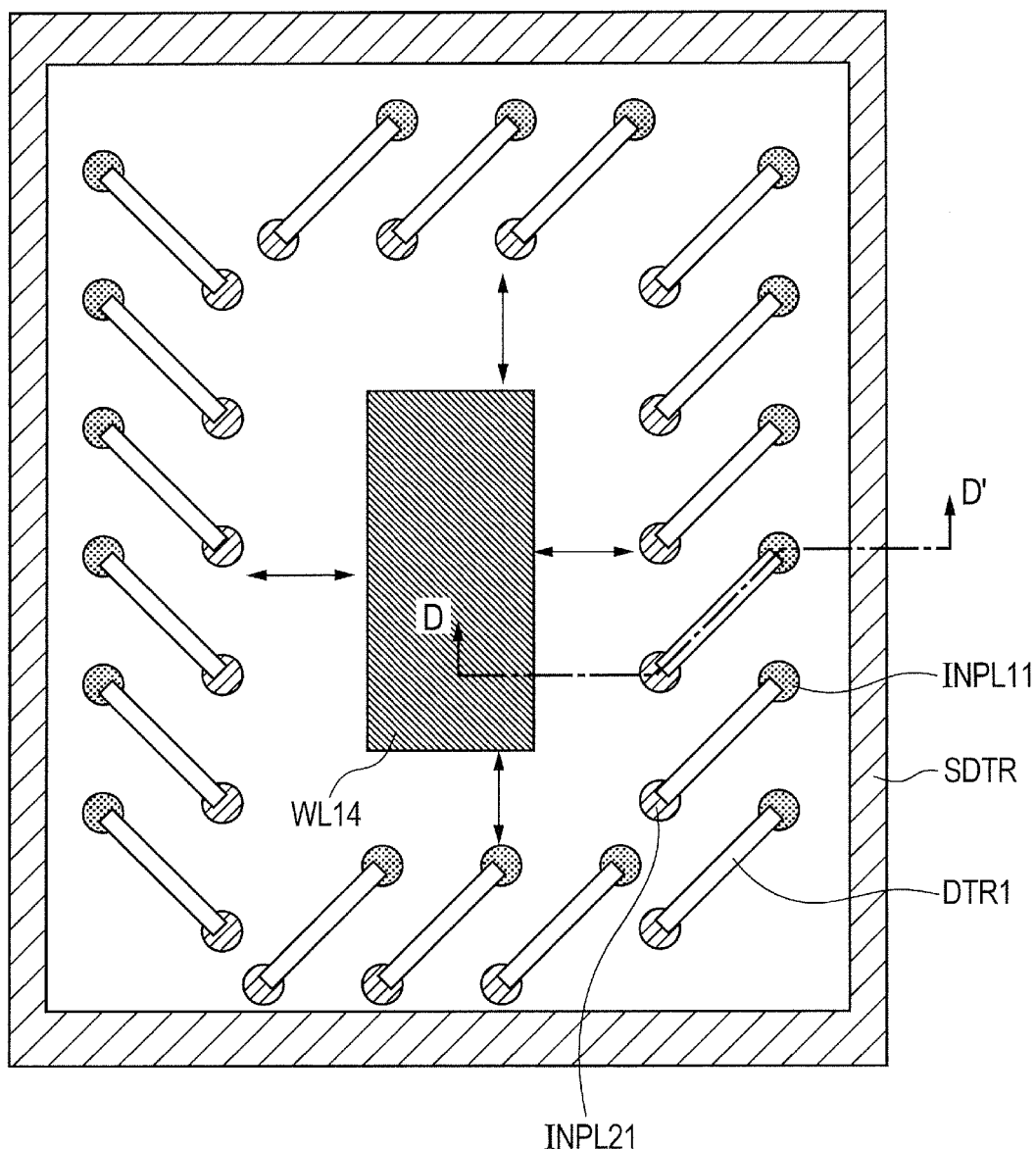
FIG. 18 is a diagram illustrating a modified example of the diode illustrated in FIG. 17.

Incidentally, as illustrated in the plan view in FIG. 18, in the present embodiment, the second trench DTR2 illustrated in FIG. 12 may be provided. In this case, the first-conductivity type region INPL11 is also formed on the side of one end of the second trench DTR2 and the second-conductivity type region INPL21 is also formed on the side of the other end of the second trench DTR2.

Then, the manufacturing method for the semiconductor device SD illustrated in FIG. 18 is the same as the manufacturing method for the semiconductor devices SD illustrated in FIG. 16 and FIG. 17, excepting processes for forming the first-conductivity type region INPL11 and the second-conductivity type region INPL21. In the semiconductor device SD illustrated in FIG. 18, the angle at which the impurity ions are implanted into to the substrate SUB is changed in the middle when the first-conductivity type region INPL11 is formed. In addition, the angle at which the impurity ions are implanted into the substrate SUB is changed in the middle also when the second-conductivity type region INPL21 is formed. Thereby, the first-conductivity type region INPL11 and the second-conductivity type region INPL21 are formed relative to each of the first trench DTR1 and the second trench DTR2.

Figure 19:
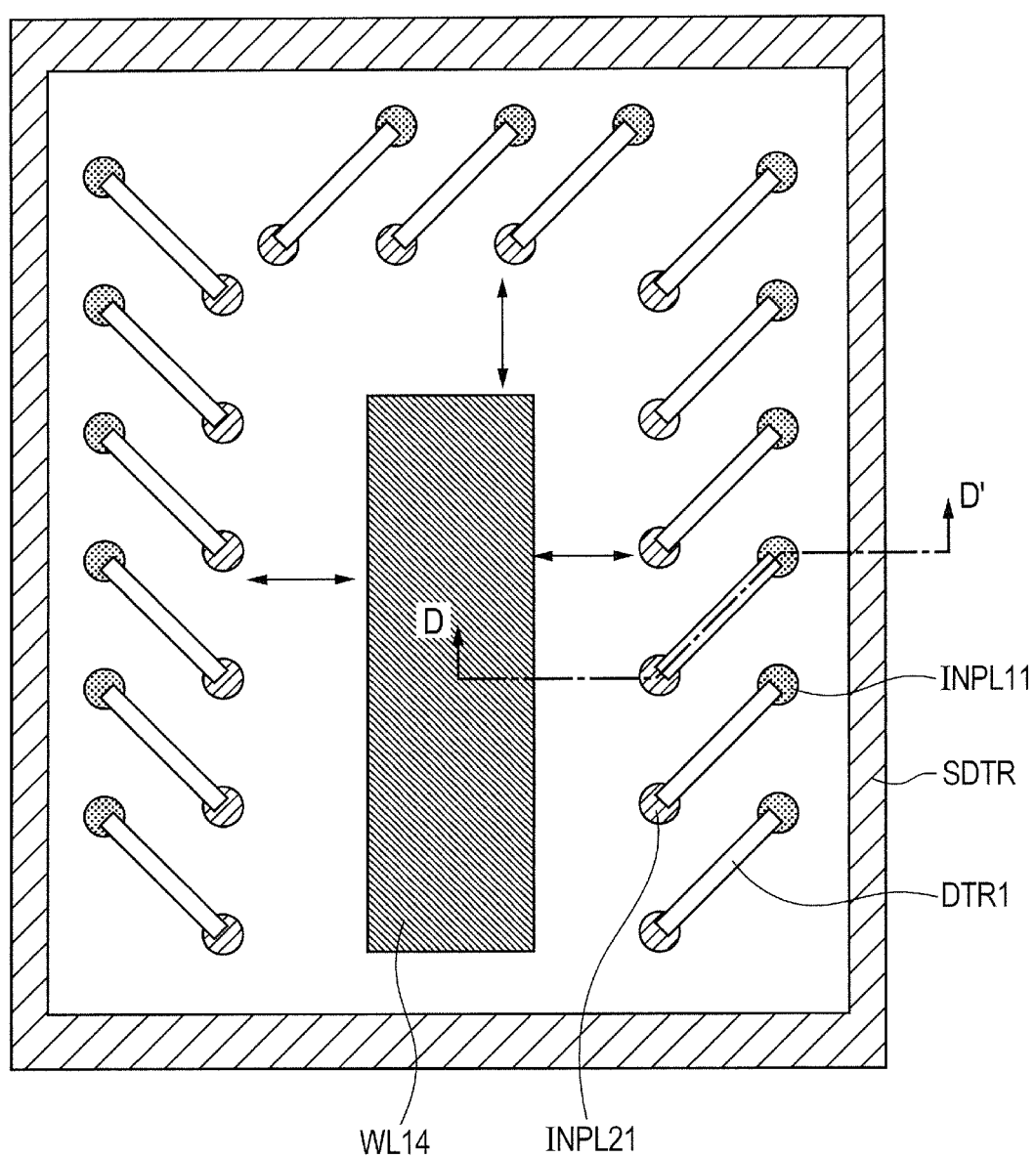
FIG. 19 is a diagram illustrating a modified example of the diode illustrated in FIG. 17.
Figure 20:
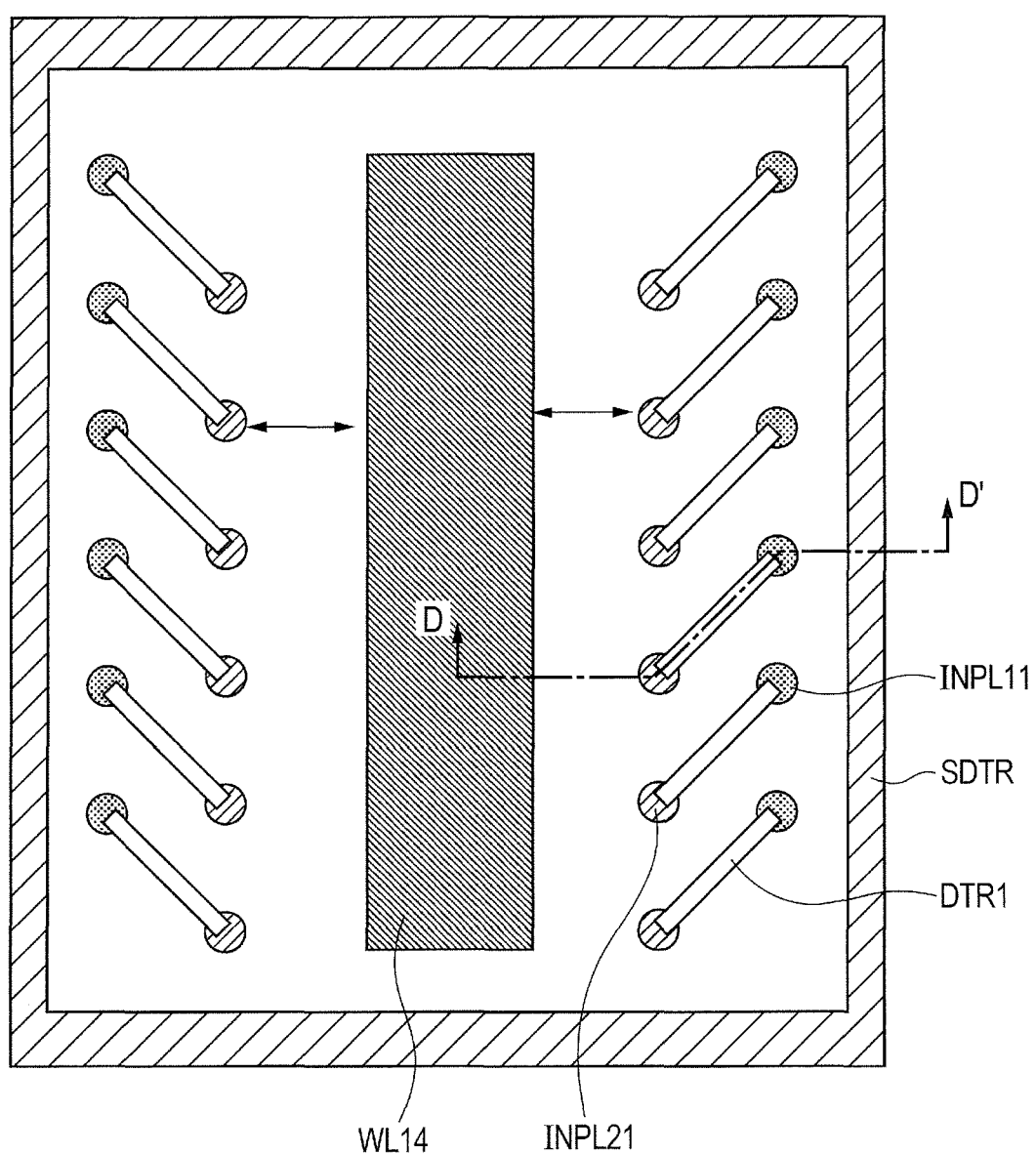
FIG. 20 is a diagram illustrating a modified example of the diode illustrated in FIG. 17.

In addition, the arrangement of the first-conductivity type regions INPL11 may be made in the same way as that in the example illustrated in FIG. 13 as illustrated in FIG. 19. In addition, the arrangement of the first-conductivity type regions INPL11 may be made in the same way as that in the example illustrated in FIG. 14 as illustrated in FIG. 20.

According to the present embodiment, it is possible to form the first-conductivity type region INPL11 on the side of one end of each first trench DTR1 and to form the second-conductivity type region INPL21 on the side of the other end of each first trench DTR1. Accordingly, it becomes unnecessary to increase the number of the first trenches DTR1 in a case where the first-conductivity type regions INPL11 and the second-conductivity type regions INPL21 are to be formed.

Eighth Embodiment

Figure 21:
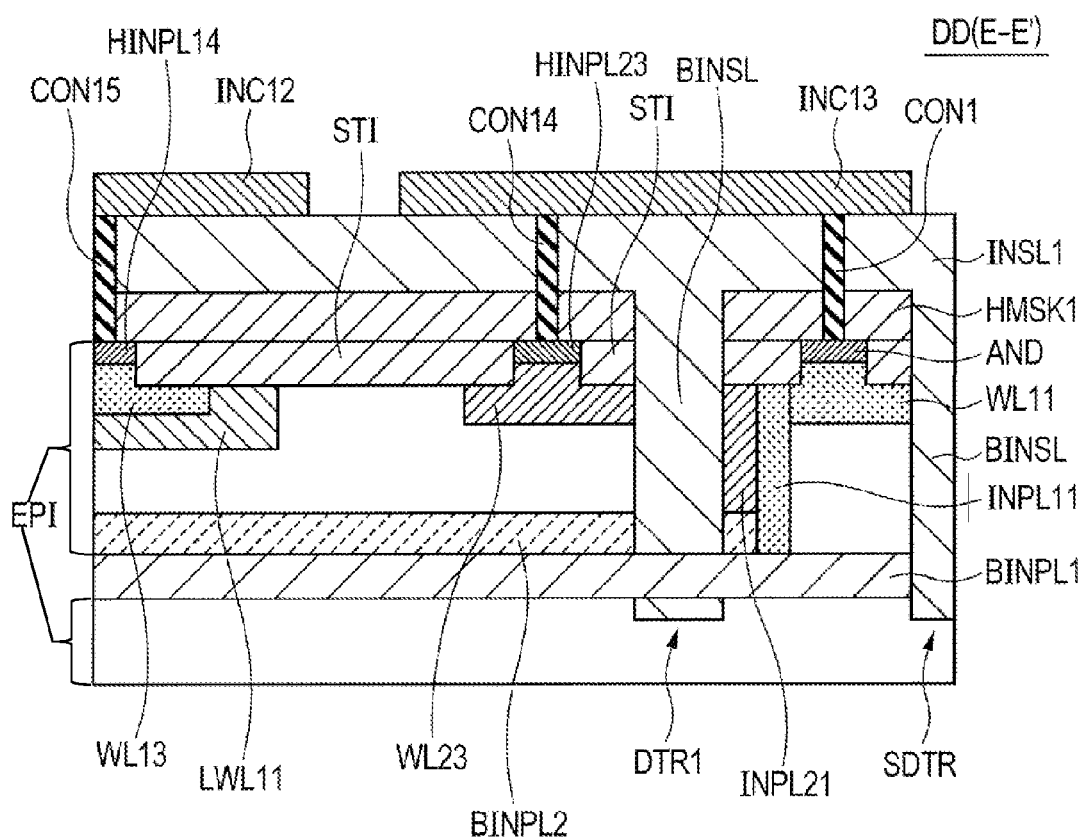
FIG. 21 is a sectional diagram illustrating one example of the diode that the semiconductor device according to an eighth embodiment includes.
Figure 22:
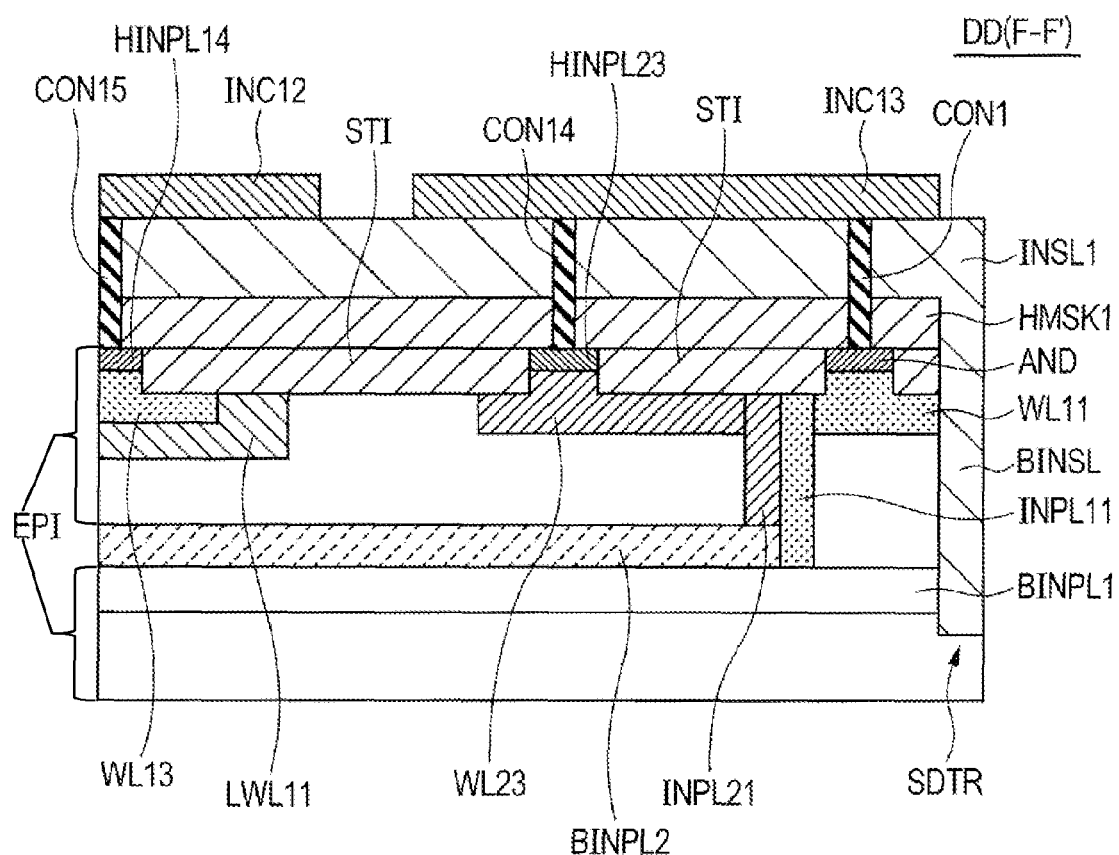
FIG. 22 is a sectional diagram illustrating one example of the diode that the semiconductor device according to the eighth embodiment includes.
Figure 23:
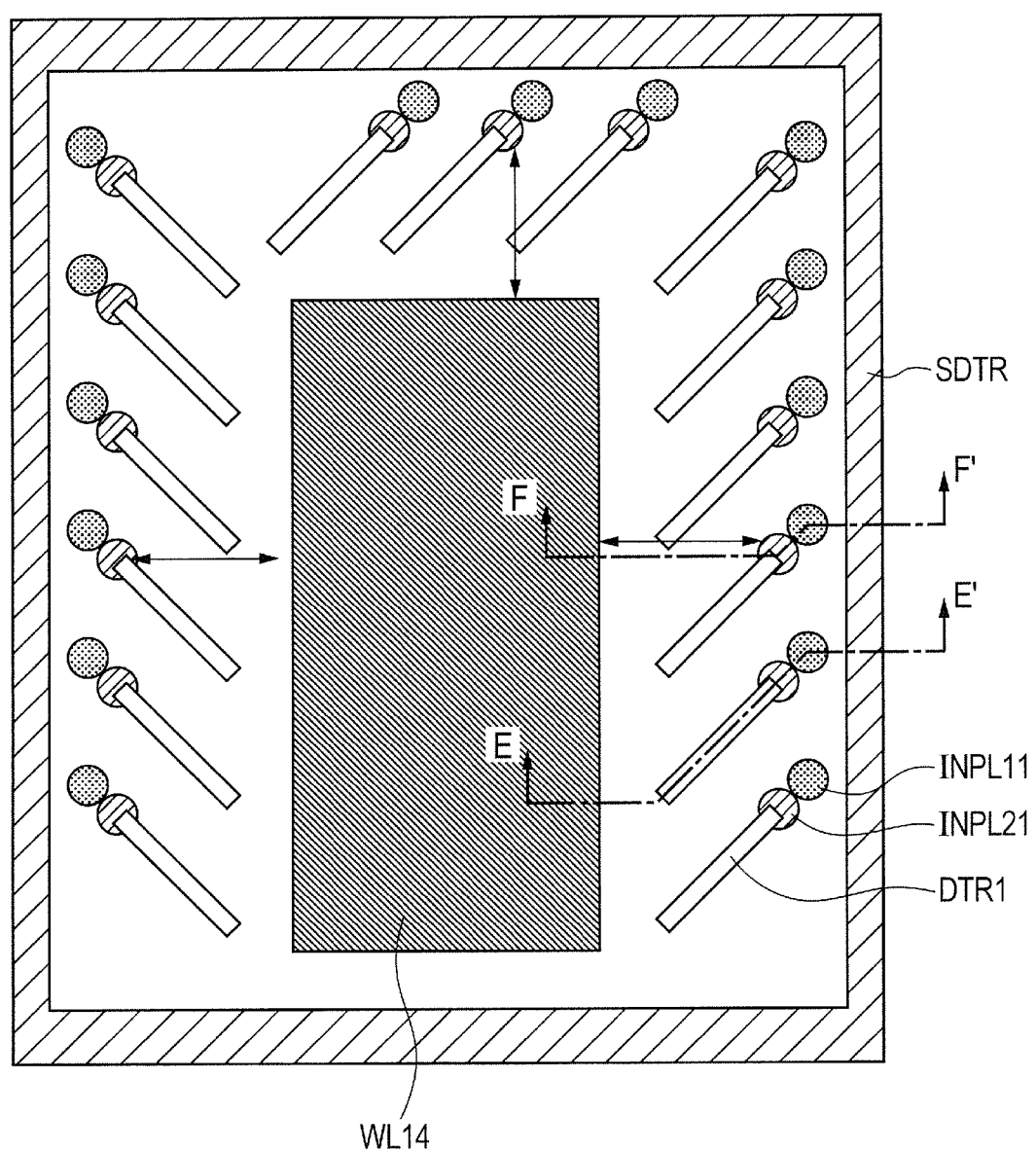
FIG. 23 is a plan view illustrating one example of the diode illustrated in FIG. 21 and FIG. 22.

FIG. 21 and FIG. 22 are sectional diagrams each illustrating one example of the diode DD that the semiconductor device SD according to an eighth embodiment includes. FIG. 23 is a plan view of the diode DD. Then, FIG. 21 is the sectional diagram taken along the E-E' line in FIG. 23 and FIG. 22 is the sectional diagram taken along the F-F' line in FIG. 23. The configuration of the diode DD illustrated in these drawings is the same as that of the diode DD according to the seventh embodiment, excepting a point that the first-conductivity type region INPL11 and the second-conductivity type region INPL21 are formed on the same end side of each first trench DTR1.

Describing in detail, the first-conductivity type region INPL11 and the second-conductivity type region INPL21 are arranged side by side in the direction that each first trench DTR1 extends. Although in the example illustrated in FIGS. 23 and 24, the second-conductivity type region INPL21 is located closer to the first trench DTR1 than the first-conductivity type region INPL11 is to the first trench DTR1, the relative position of these regions may be reversed. Then, the first trench DTR1 is superposed on the p-type well WL23.

The manufacturing method for the semiconductor device SD illustrated in FIG. 23 is the same as the manufacturing method for the semiconductor device SD according to the seventh embodiment, excepting processes for forming the first-conductivity type region INPL11 and the second-conductivity type region INPL21. In the present embodiment, the angle of the substrate SUB when the first-conductivity type region INPL11 is to be formed is the same as the angle of the substrate SUB when the second-conductivity type region INPL21 is to be formed. Then, the first-conductivity type region INPL11 and the second-conductivity type region INPL21 are formed so as not to be mutually superposed by making ion implantation energy exerted when the first-conductivity type region INPL11 is to be formed different from ion implantation energy exerted when the second-conductivity type region INPL21 is to be formed.

Figure 24:
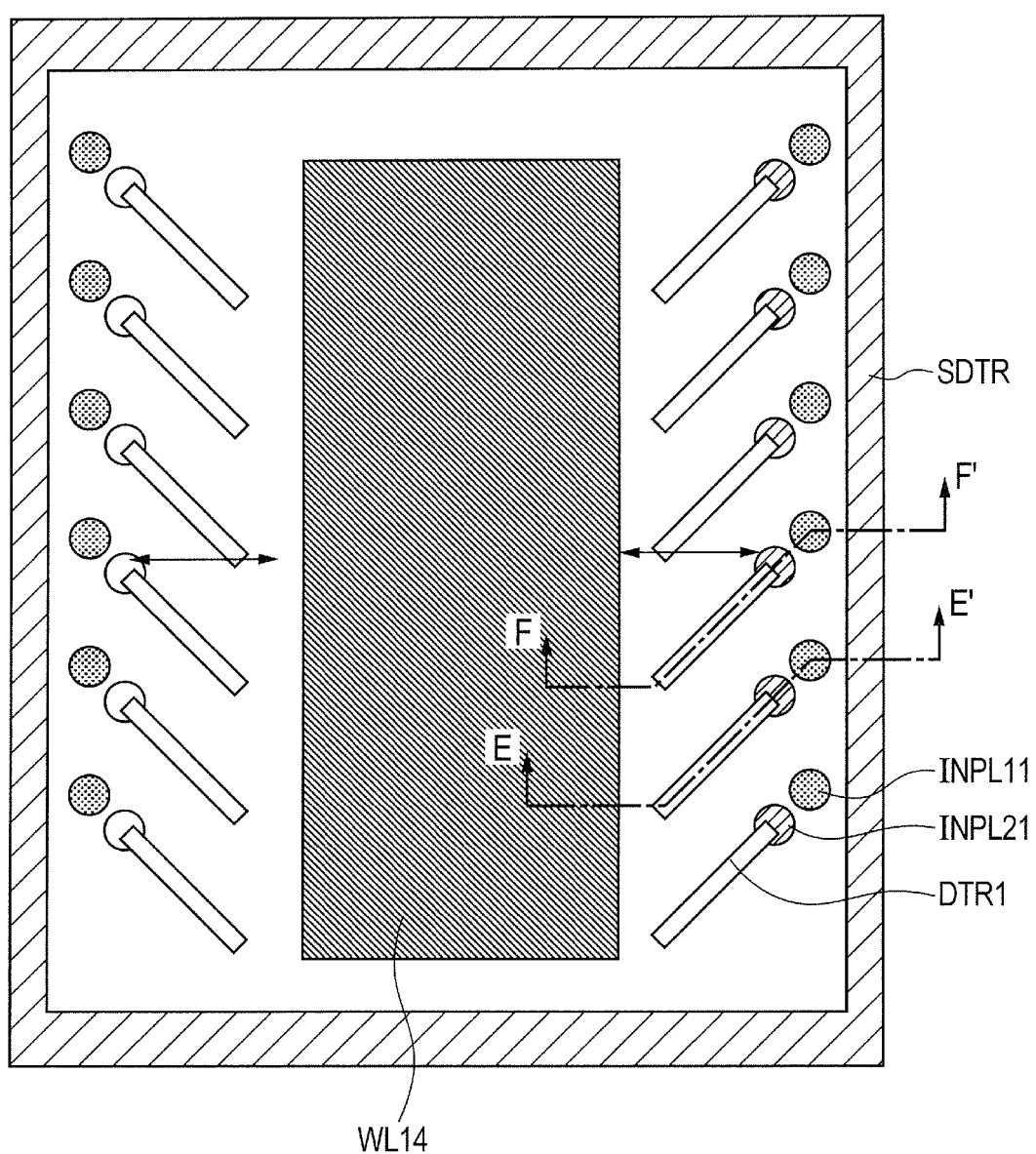
FIG. 24 is a diagram illustrating a modified example of the diode in FIG. 23.

Incidentally, also in the present embodiment, the arrangement of the first trenches DTR1 may be made in the same way as the arrangement in the example illustrated in FIG. 20 as illustrated in FIG. 24. In addition, though not illustrated, the arrangement of the first trenches DTR1 may be made in the same way as the arrangement in the example illustrated in FIG. 17 and may be made in the same way as the arrangement in the example illustrated in FIG. 18.

Also according to the present embodiment, it becomes unnecessary to increase the number of the first trenches DTR1 in a case where the first-conductivity type regions INPL11 and the second-conductivity type regions INPL21 are to be formed.

Although, in the foregoing, the invention made by the inventors of the present invention has been specifically described on the basis of the preferred embodiments, it goes without saying that the present invention is not limited to the aforementioned embodiments and may be modified in a variety of ways within the scope not deviating from the gist of the present invention.

What is claimed is:

1. A semiconductor device comprising:
    a substrate;
    an element isolation trench formed in the substrate,
    the element isolation trench has a rectangular or square shape boundary in a planar view, the rectangular or square shape boundary having a first side, a second side opposite to the first side, and a third side perpendicular to both the first and the second side;
    a plurality of first trenches formed in the substrate and in the planar view, the length of the first trenches extend in a first direction with respect to the first side of the element isolation trench, wherein the plurality of first trenches protrude into enter the boundary of the element isolation trench at the first side of the rectangular or square shape in the first direction towards the third side of the rectangular or square shape and wherein the first trenches are insulative and rectangular in the planar view;
    a plurality of second trenches formed in the substrate and in the planar view, the length of the second trenches extend in a second direction with respect to the first side of the element isolation trench, the second direction being different from the first direction, wherein the plurality of second trenches protrude into the boundary of the element isolation trench, at the second side of the rectangular or square shape, in the second direction towards the third side of the rectangular or square shape and wherein the second trenches are insulative and rectangular in the planar view; and
    a first first-conductivity type region formed over a part located on a side of an end of the first trench in the substrate in the cross section view of the substrate through the element isolation trench.

2. The semiconductor device according to claim 1,
    wherein the substrate is of a second-conductivity type,
    wherein the first trench is located inside of a region surrounded by the element isolation trench,
    further comprising:
    a first first-conductivity type buried layer buried in the substrate,
    wherein a bottom face of the first trench reaches the first buried layer or is located lower than the first buried layer, and
    wherein the first first-conductivity type region is coupled to the first buried layer.

3. The semiconductor device according to claim 2, further comprising:
    a transistor formed in a region located inside of the element isolation trench in the substrate.

4. The semiconductor device according to claim 3, further comprising:
    a buried insulating film buried in a region between a drain region and a gate electrode of the transistor in the substrate.

5. The semiconductor device according to claim 2, further comprising:
    a first second-conductivity-type region formed in a region located inside of the element isolation trench in the substrate and being higher in impurity concentration than the substrate;
    a first contact to be electrically coupled to the first first-conductivity type region; and
    a second contact to be electrically coupled to the first second-conductivity type region.

6. The semiconductor device according to claim 5,
    wherein a plurality of the first trenches are arranged along at least a part of the element isolation trench, and
    wherein the first first-conductivity type region is formed for each of the first trenches.

7. The semiconductor device according to claim 6,
    wherein the first trenches are arranged along mutually facing first side and second side of the rectangle,
    wherein the first trenches so arranged along the first side extend in a first direction,
    wherein the first trenches so arranged along the second side extend in a second direction that is different from the first direction, and
    wherein the first first-conductivity type region is formed on the side of an end of two ends of the first trench that is closer to the element isolation trench.

8. The semiconductor device according to claim 7,
    wherein the second direction is orthogonal to the first direction.

9. The semiconductor device according to claim 6,
    wherein the first first-conductivity type region is formed on the side of each of the two ends of the first trench.

10. The semiconductor device according to claim 2,
    further comprising:
    a second-conductivity type buried layer formed over the first embedded layer and being in contact with the first buried layer;
    a second-conductivity type region formed over a part located on the side of the other end of the first trench in the substrate and coupled to the second buried layer;
    a first contact to be electrically coupled to the first first-conductivity type region, and a third contact to be electrically coupled to the second-conductivity type region.

11. The semiconductor device according to claim 2, further comprising:
   a second-conductivity type buried layer formed over the first buried layer and being in contact with the first buried layer;
   a second-conductivity type region formed over a part located on the side of the end of the first trench in the substrate;
   wherein the first first-conductivity type region and the second-conductivity type region are arranged side by side in a direction that the first trench extends,
   wherein the second-conductivity type region is coupled to the second-conductivity type buried layer,
   and further
   a first contact to be electrically coupled to the first first-conductivity type region, and
   a third contact to be electrically coupled to the second-conductivity type region.

12. The semiconductor device according to claim 1, wherein the first trench extends at an angle of at least about 30 degrees and not more than about 60 degrees relative to each side of the element isolation trench.

13. The semiconductor device according to claim 2, wherein in the planar view, the plurality of first trenches protrude into the boundary of the element isolation trench at the first side at an angle of at least about 30 degrees and not more than about 60 degrees relative to the first side of the element isolation trench.

14. The semiconductor device according to claim 1, wherein the first direction is orthogonal to the second direction.

15. The semiconductor device according to claim 1, wherein the first trenches extend toward the third side at a first angle between 30 to 60 degrees with respect to the first side, and the second trenches mirrors the first trenches across a center line of the rectangular or square shape boundary.

16. The semiconductor device according to claim 1, wherein the plurality of first trenches formed in the substrate and in the planar view extending and crossing the boundary of the element isolation trench at the first direction different from directions of each side of the rectangular or square shape boundary of the element isolation trench.

* * * * *